United States Patent
Lee

(10) Patent No.: US 10,134,724 B2
(45) Date of Patent: Nov. 20, 2018

(54) ELECTRO-STATIC DISCHARGE PROTECTION DEVICES HAVING A LOW TRIGGER VOLTAGE

(71) Applicant: SK hynix Inc., Gyeonggi-do (KR)

(72) Inventor: Hyun Duck Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/796,309

(22) Filed: Oct. 27, 2017

(65) Prior Publication Data
US 2018/0068996 A1 Mar. 8, 2018

Related U.S. Application Data

(62) Division of application No. 15/173,244, filed on Jun. 3, 2016, now Pat. No. 9,831,234.

(30) Foreign Application Priority Data
Dec. 21, 2015 (KR) .................... 10-2015-0183287

(51) Int. Cl.
*H01L 23/62* (2006.01)
*H01L 27/02* (2006.01)
*H01L 29/74* (2006.01)

(52) U.S. Cl.
CPC ...... *H01L 27/0262* (2013.01); *H01L 29/7408* (2013.01); *H01L 29/7436* (2013.01)

(58) Field of Classification Search
CPC .................. H01L 27/0262; H01L 29/7408
USPC .................. 257/356, 358, 360, 361
See application file for complete search history.

(56) References Cited

U.S. PATENT DOCUMENTS

2006/0125054 A1* 6/2006 Kim ............. H01L 27/0262
257/607

* cited by examiner

*Primary Examiner* — Tan N Tran
(74) *Attorney, Agent, or Firm* — IP & T Group LLP

(57) ABSTRACT

An electro-static discharge (ESD) protection device includes a first PN diode, a second PN diode and a silicon controlled rectifier (SCR). The first PN diode and the second PN diode are coupled in series between a pad and a ground voltage to provide a first discharge current path. The SCR is coupled between the pad and the ground voltage to provide a second discharge current path. The SCR has a PNPN structure.

7 Claims, 18 Drawing Sheets

ELECTRO-STATIC DISCHARGE PROTECTION DEVICES HAVING A LOW TRIGGER VOLTAGE

CROSS-REFERENCE TO RELATED APPLICATIONS

This application is a division of U.S. patent application Ser. No. 15/173,244 filed on Jun. 3, 2016, which claims priority under 35 U.S.C. 119(a) to Korean Patent Application No. 10-2015-0183287, filed on Dec. 21, 2015. The disclosure of each of the foregoing application is incorporated herein by references in its entirety.

BACKGROUND

1. Technical Field

Various embodiments of the present disclosure relate to electro-static discharge (ESD) protection devices and, more particularly, to ESD protection devices having a low trigger voltage.

2. Related Art

In general, most semiconductor devices include ESD protection circuits, each of which is coupled between a signal pad or a data pad and a ground pad to protect inner circuits of the semiconductor devices. If the signal pad or the data pad of the semiconductor device is in contact with a charged human body or a charged machine, static electricity may be generated which produces a high voltage and the high voltage may be applied to the signal pad. In such a case, the ESD protection circuit connected to the signal pad may provide a bypass current path to prevent an inner circuit of the semiconductor device from being damaged. In development of micro-chips, a design technology of the ESD protection circuit becomes more and more important to protect the micro-chips from ESD stress and to provide highly reliable micro-chips. The ESD protection circuit may be referred to as ESD protection device.

A gate grounded N-type MOS field effect transistor GGN-MOS device has been widely used as the ESD protection device. However, if the GGNMOS device is employed as the ESD protection device of a chip, it may be difficult to reduce a size of the chip since the GGNMOS device occupies a relatively large area. In general, a current tolerance value of the GGNMOS device is merely within the range of about 5 mA/μm to about 10 mA/μm. Thus, to meet an industrial standard value such as, 2 amperes of an ESD current, the GGNMOS device has to be designed to have a channel width of about 200 μm to about 400 μm. In addition, a drain region of the GGNMOS device has to be designed to have a relatively large area to obtain an excellent ESD characteristic of a chip. Accordingly, if the GGNMOS device is employed as the ESD protection device, there may be a limitation in designing highly integrated micro-chips.

Moreover, since the GGNMOS device used as the ESD protection device is coupled to a ground pad, the ESD protection device may exhibit a relatively high trigger voltage. If the trigger voltage of the ESD protection device is relatively high, a high voltage signal generated by static electricity may be transmitted to an inner circuit of the chip. As a result, the inner circuit of the chip may be damaged and may cause malfunction of the chip.

SUMMARY

Various embodiments are directed to ESD protection devices having a low trigger voltage.

According to one embodiment, an ESD protection device includes a first PN diode, a second PN diode and a silicon controlled rectifier (SCR). The first PN diode and the second PN diode are coupled in series between a pad and a ground voltage to provide a first discharge current path. The SCR is coupled between the pad and the ground voltage to provide a second discharge current path. The SCR has a PNPN structure.

According to another embodiment, an ESD protection device includes an N-type well region and a P-type well region disposed in an upper portion of a P-type substrate to contact each other and to provide a PN junction therebetween, a first P-type junction region disposed in an upper portion of the N-type well region and electrically connected to a pad, a first N-type junction region disposed in an upper portion of the N-type well region spaced apart from the first P-type junction region, a second P-type junction region disposed in an upper portion of the P-type well region to directly contact the first N-type junction region at the PN junction between the N-type well region and the P-type well region, a second N-type junction region disposed in an upper portion of the P-type well region spaced apart from the second P-type junction region and electrically connected to the ground voltage, and a first connection line electrically connecting the first N-type junction region to the second P-type junction region.

According to another embodiment, an ESD protection device includes an N-type well region and a P-type well region disposed in an upper portion of a P-type substrate to contact each other and to provide a PN junction therebetween, a first P-type junction region disposed in an upper portion of the N-type well region and electrically connected to a pad, a first N-type junction region disposed in an upper portion of the N-type well region spaced apart from the first P-type junction region and in direct contact with the P-type well region at the PN junction between the N-type well region and the P-type well region, a second N-type junction region disposed in an upper portion of the N-type well region spaced apart from the first P-type junction region and the first N-type junction region, a third N-type junction region disposed in an upper portion of the P-type well region and electrically connected to the ground voltage, a second P-type junction region disposed in an upper portion of the P-type well region spaced apart from the third N-type junction region, and a connection line electrically connecting the second N-type junction region to the second P-type junction region.

According to another embodiment, an ESD protection device includes an N-type well region and a P-type well region disposed in an upper portion of a P-type substrate to contact with each other and to provide a PN junction therebetween, a first P-type junction region disposed in an upper portion of the N-type well region and electrically connected to a pad, a first N-type junction region disposed in an upper portion of the N-type well region spaced apart from the first P-type junction region, a second N-type junction region disposed in an upper portion of the P-type well region and electrically connected to the ground voltage, a second P-type junction region disposed in an upper portion of the P-type well region spaced apart from the second N-type junction region and in direct contact with the N-type well region at the PN junction between the N-type well region and the P-type well region, a third P-type junction region disposed in an upper portion of the P-type well region spaced apart from the second P-type junction region and the second N-type junction region, and a connection line electrically connecting the first N-type junction region to the third P-type junction region.

According to another embodiment, an ESD protection device includes an N-type well region and a P-type well region being in contact with each other to provide a PN junction therebetween, a first junction segment and a second junction segment disposed in the N-type well region spaced apart from each other in a first direction, and a third junction segment and a fourth junction segment disposed in the P-type well region spaced apart from each other in the first direction. The second and fourth junction segments are in contact with each other at the PN junction between the N-type well region and the P-type well region.

According to another embodiment, an ESD protection device includes an N-type well region and a P-type well region being in contact with each other to provide a PN junction therebetween, first to third junction segments disposed in the N-type well region spaced apart from each other in a first direction, and a fourth junction segment and a fifth junction segment disposed in the P-type well region spaced apart from each other in the first direction. The first junction segment is disposed between the second junction segment and the third junction segment. The second junction segment is in contact with the P-type well region at the PN junction between the N-type well region and the P-type well region.

According to another embodiment, an ESD protection device includes an N-type well region and a P-type well region being in contact with each other to provide a PN junction therebetween, a first junction segment and a second junction segment disposed in the N-type well region spaced apart from each other in a first direction, and third to fifth junction segments disposed in the P-type well region spaced apart from each other in the first direction. The third junction segment is disposed between the fourth junction segment and the fifth junction segment. The fourth junction segment is in contact with the N-type well region at the PN junction between the N-type well region and the P-type well region.

BRIEF DESCRIPTION OF THE DRAWINGS

Various embodiments of a present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under," "beneath," "below," "lower," "on," "over," "above," "upper," "side" or "aside" another element, it can directly contact the other element, or at least one intervening element may also be present therebetween. Accordingly, the terms such as "under," "beneath," "below," "lower," "on," "over," "above," "upper," "side," "aside" and the like which are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
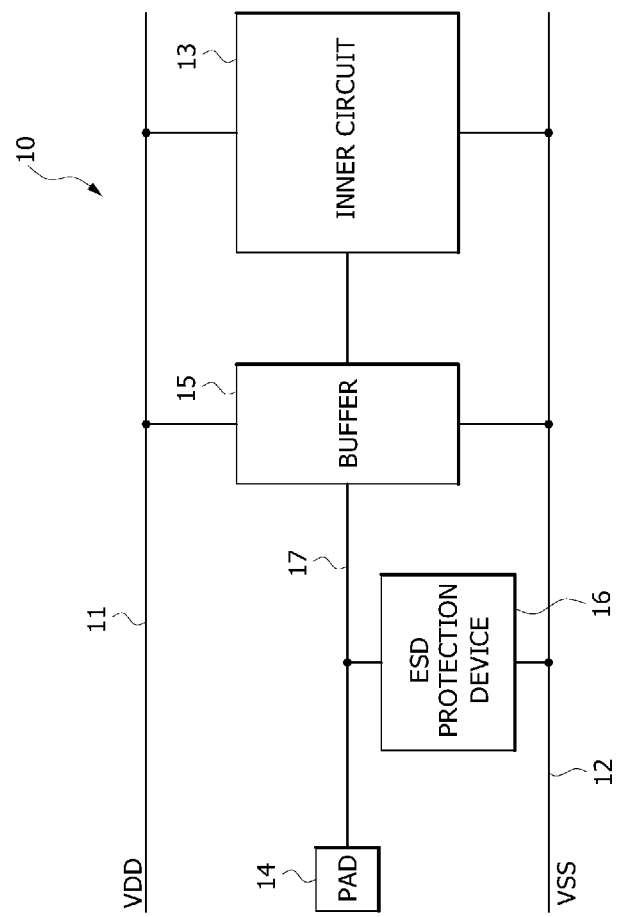
FIG. 1 is a block diagram illustrating an input/output (I/O) unit including an ESD protection device.

FIG. 1 is a block diagram illustrating an input/output (I/O) unit 10 including an ESD protection device 16.

Referring to FIG. 1, the I/O unit 10 of a chip may include an inner circuit 13 coupled between a first line 11 connected to a power supply voltage VDD and a second line 12 connected to a ground voltage VSS. The I/O unit 10 may further include a buffer 15 and the ESD protection device 16. The buffer 15 may be coupled between the inner circuit 13 and a pad 14, and the ESD protection device 16 may be coupled between a third line 17 connected to the pad 14 and the second line 12 connected to the ground voltage VSS. The pad 14 may correspond to an I/O pad.

In general, each of the inner circuit 13 and the buffer 15 may include a plurality of MOS transistors. As semiconductor chips become more highly integrated and operate at a high speed, a thickness of gate insulation layers of the MOS transistors has been reduced. Thus, a breakdown voltage of the insulation layers of the MOS transistors may be lowered. That is, the insulation layers of the MOS transistors may be easily damaged if a high voltage signal is applied to gate electrodes of the MOS transistors constituting the buffer 15 or the inner circuit 13. Accordingly, the ESD protection device 16 has to be designed to have a low trigger voltage.

The following embodiments provide various ESD protection devices having a low trigger voltage to protect the inner circuit 13 from ESD stress.

Figure 2:
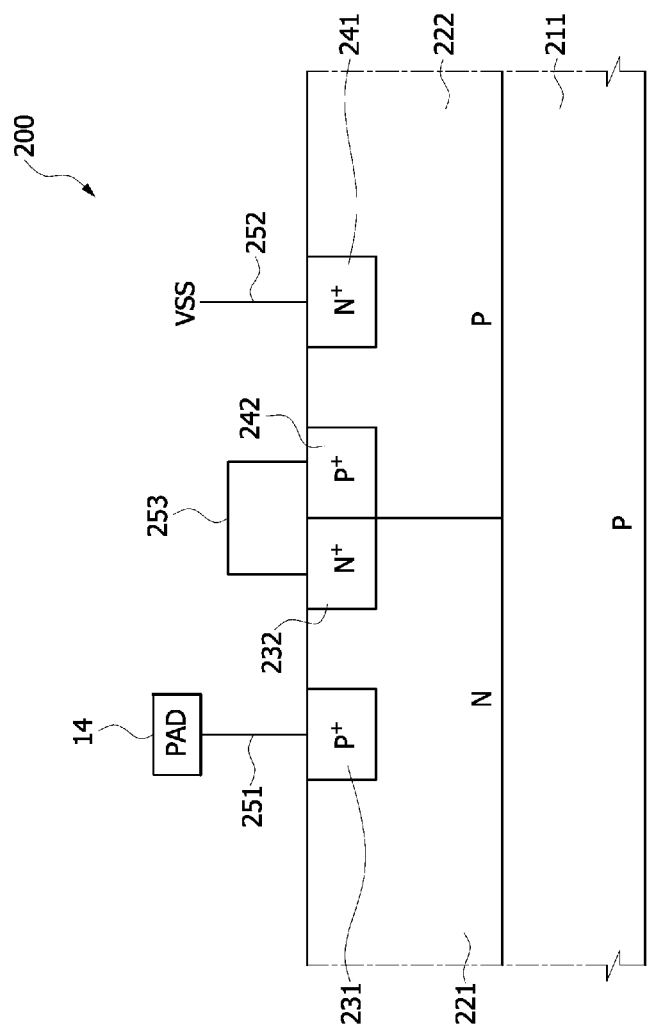
FIG. 2 is a cross-sectional view illustrating an ESD protection device according to an embodiment.

FIG. 2 is a cross-sectional view illustrating an ESD protection device 200 according to an embodiment.

Referring to FIG. 2, the ESD protection device 200 may include an N-type well region 221 and a P-type well region 222 which are disposed in an upper portion of a P-type substrate 211. A sidewall of the N-type well region 221 may contact a sidewall of the P-type well region 222.

A first P-type junction region 231 and a first N-type junction region 232 may be disposed in an upper portion of the N-type well region 221 spaced apart from each other. The first P-type junction region 231 may be connected to the pad 14 through a first signal line 251. A sidewall of the first N-type junction region 232 opposite to the first P-type junction region 231 may be aligned with a sidewall of the N-type well region 221.

A second P-type junction region 242 and a second N-type junction region 241 may be disposed in an upper portion of the P-type well region 222 spaced apart from each other. The second N-type junction region 241 may be connected to the ground voltage VSS through a second signal line 252. A sidewall of the second P-type junction region 242 opposite to the second N-type junction region 241 may be aligned with a sidewall of the P-type well region 222. A sidewall of the first N-type junction region 232 may contact a sidewall of the second P-type junction region 242. The first N-type junction region 232 may be electrically connected to the second P-type junction region 242 through a connection line 253.

The first P-type junction region 231, the N-type well region 221 and the first N-type junction region 232, the second P-type junction region 242 and the P-type well region 222, and the second N-type junction region 241 may constitute a silicon controlled rectifier (SCR) having a PNPN junction structure coupled between the first and second signal lines 251 and 252.

The first P-type junction region 231 and the N-type well region 221/the first N-type junction region 232 may constitute a first PN diode. The second P-type junction region 242/the P-type well region 222 and the second N-type junction region 241 may constitute a second PN diode. A cathode such as, the first N-type junction region 232 of the first PN diode may be connected to an anode such as, the second P-type junction region 242 of the second PN diode through the connection line 253.

Figure 3:
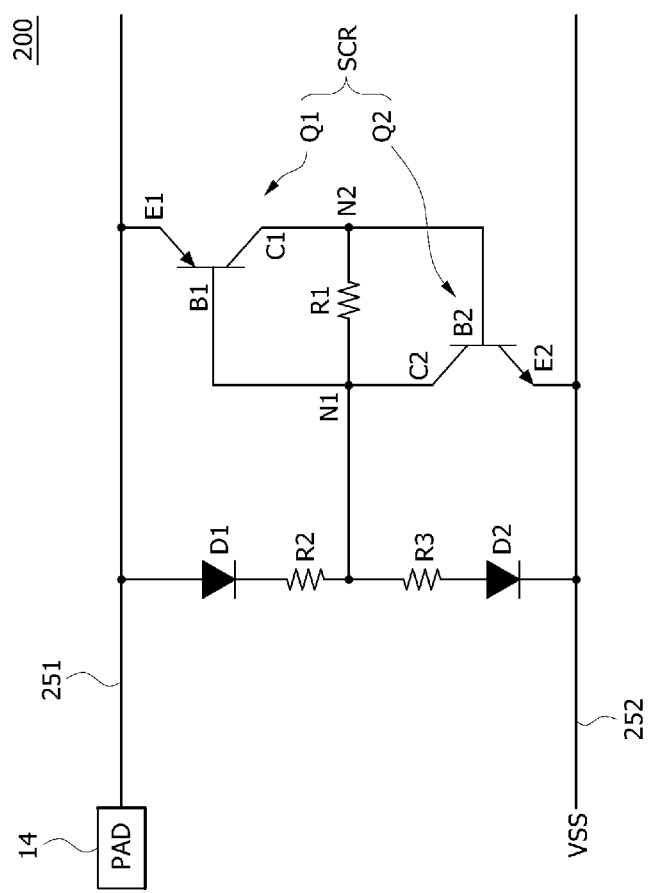
FIG. 3 is an equivalent circuit diagram of the ESD protection device shown in FIG. 2.

FIG. 3 is an equivalent circuit diagram of the ESD protection device 200 shown in FIG. 2.

Referring to FIGS. 2 and 3, the PNPN structural SCR may be coupled between the first signal line 251 connected to the pad 14 and the second signal line 252 connected to the ground voltage VSS. The PNPN structural SCR may include a PNP bipolar junction transistor (BJT) Q1 and an NPN bipolar junction transistor (BJT) Q2. An emitter E1 of the PNP BJT Q1 may be connected to the first signal line 251. A base B1 of the PNP BJT Q1 may be connected to a collector C2 of the NPN BJT Q2 through a first node N1. A collector C1 of the PNP BJT Q1 may be connected to a base B2 of the NPN BJT Q2 through a second node N2. A resistive element R1 corresponding to the connection line 253 may be coupled between the first node N1 and second node N2. The collector C2 of the NPN BJT Q2 may be connected to the base B1 of the PNP BJT Q1 through the first node N1. The base B2 of the NPN BJT Q2 may be connected to the collector C1 of the PNP BJT Q1 through the second node N2. An emitter E2 of the NPN BJT Q2 may be connected to the second signal line 252.

The emitter E1, the base B1, and the collector C1 of the PNP BJT Q1 may correspond to the first P-type junction region 231, the N-type well region 221/the first N-type junction region 232, and the second P-type junction region 242/the P-type well region 222, respectively. The collector C2, the base B2, and the emitter E2 of the NPN BJT Q2 may correspond to the N-type well region 221/the first N-type junction region 232, the second P-type junction region 242/the P-type well region 222, and the second N-type junction region 241, respectively.

A first PN diode D1 and a second PN diode D2 may be coupled in series between the first signal line 251 and the second signal line 252. An anode of the first PN diode D1 may be connected to the first signal line 251. A cathode of the first PN diode D1 may be connected to the first node N1 through a resistive element R2. An anode of the second PN diode D2 may be connected to the first node N1 through a resistive element R3. A cathode of the second PN diode D2 may be connected to the second signal line 252. A sum of resistance values of the resistive elements R2 and R3 coupled in series between the cathode of the first PN diode D1 and the anode of the second PN diode D2 may correspond to a resistance value of the connection line 253. The anode of the first PN diode D1 may correspond to the first P-type junction region 231, and the cathode of the first PN diode D1 may correspond to the N-type well region 221/the first N-type junction region 232. The anode of the second PN diode D2 may correspond to the second P-type junction region 242/the P-type well region 222, and the cathode of the second PN diode D2 may correspond to the second N-type junction region 241.

Figure 4:
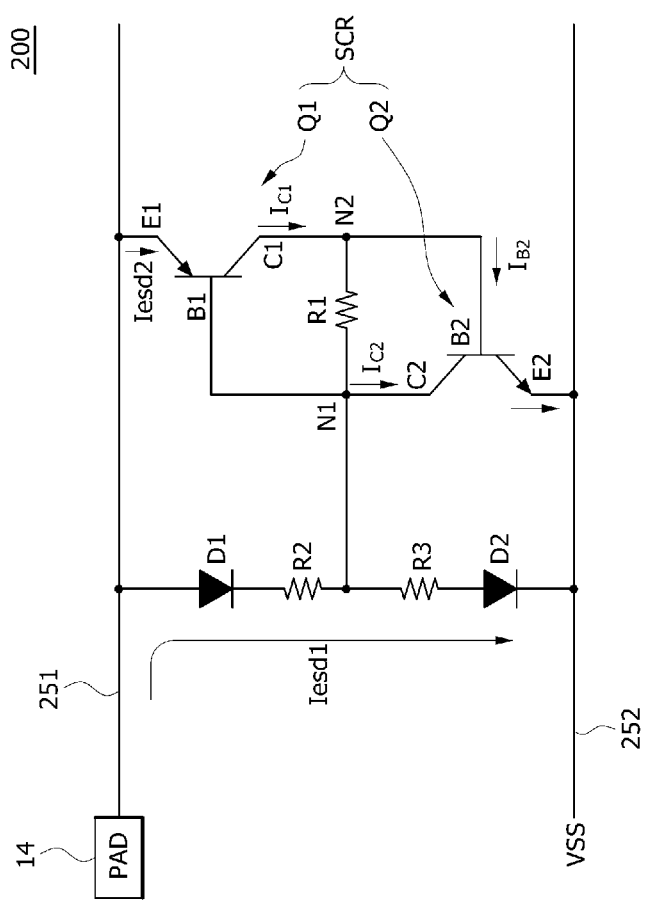
FIG. 4 is an equivalent circuit diagram illustrating an operation of the ESD protection device shown in FIG. 2.

FIG. 4 is an equivalent circuit diagram illustrating an operation of the ESD protection device 200 shown in FIG. 2. In FIG. 4, the same reference designators used in FIG. 3 denote the same elements.

Referring to FIGS. 2 and 4, if an ESD event occurs at the pad 14, a first ESD current Iesd1 may flow from the pad 14 toward the ground voltage VSS through the first and second PN diodes D1 and D2. That is, the first ESD current Iesd1 may flow through the first P-type junction region 231, the N-type well region 221, the first N-type junction region 232, the connection line 253, the second P-type junction region 242, the P-type well region 222 and the second N-type junction region 241. The ESD operation generating the first ESD current Iesd1 flowing through the first and second PN diodes D1 and D2 may be performed if a voltage applied to the pad 14 is higher than a trigger voltage corresponding to a sum of cut-in voltages that is, threshold voltages of the first and second PN diodes D1 and D2 coupled in series between the first and second signal lines 251 and 252. If a cut-in voltage of the first and second PN diodes D1 and D2 is 0.7 volts, the trigger voltage of the ESD protection device 200 may be set to be a low voltage of about 1.4 volts.

If the first and second PN diodes D1 and D2 are turned on to generate the first ESD current Iesd1 flowing through the first and second PN diodes D1 and D2, voltage levels of the N-type well region 221 and the P-type well region 222 may be boosted to be higher than the ground voltage VSS. That is, the first and second nodes N1 and N2 may have voltage levels which are higher than the ground voltage VSS. Thus, a forward bias may be applied between the emitter E2 and the base B2 of the NPN BJT Q2 to generate a base current $I_{B2}$ injected into the base B2 of the NPN BJT Q2, and the NPN BJT Q2 may be turned on due to the base current $I_{B2}$. If the NPN BJT Q2 is turned on, a collector current $I_{C2}$ of the NPN BJT Q2 may flow through the collector C2 of the NPN BJT Q2. The collector current $I_{C2}$ may induce a base current flowing through the base B1 of the PNP BJT Q1 to turn on the PNP BJT Q1. If the PNP BJT Q1 is turned on, a collector current $I_{C1}$ of the PNP BJT Q1 may flow through the collector C1 of the PNP BJT Q1. The collector current $I_{C1}$ of the PNP BJT Q1 may induce the base current $I_{B2}$ of the NPN BJT Q2 to turn on the NPN BJT Q2. As a result, the PNPN structural SCR comprised of the PNP BJT Q1 and the NPN BJT Q2 may be turned on to provide a short circuit between the pad 14 and the ground voltage VSS. Accordingly, a second ESD current Iesd2 may flow from the pad 14 toward the ground voltage VSS through the PNPN structural SCR which is turned on.

As described above, the ESD protection device 200 may perform an ESD operation generating a first ESD current if a voltage of a higher level than a trigger voltage corresponding to a sum of cut-in voltages of the first and second PN diodes D1 and D2 is applied to the pad 14, and a PNPN structural SCR comprised of the first and second PN diodes D1 and D2 may be turned on to generate a second ESD current flowing through the PNPN structural SCR coupled between the pad 14 and the ground voltage VSS if the first ESD current flows through the first and second PN diodes D1 and D2.

Figure 5:
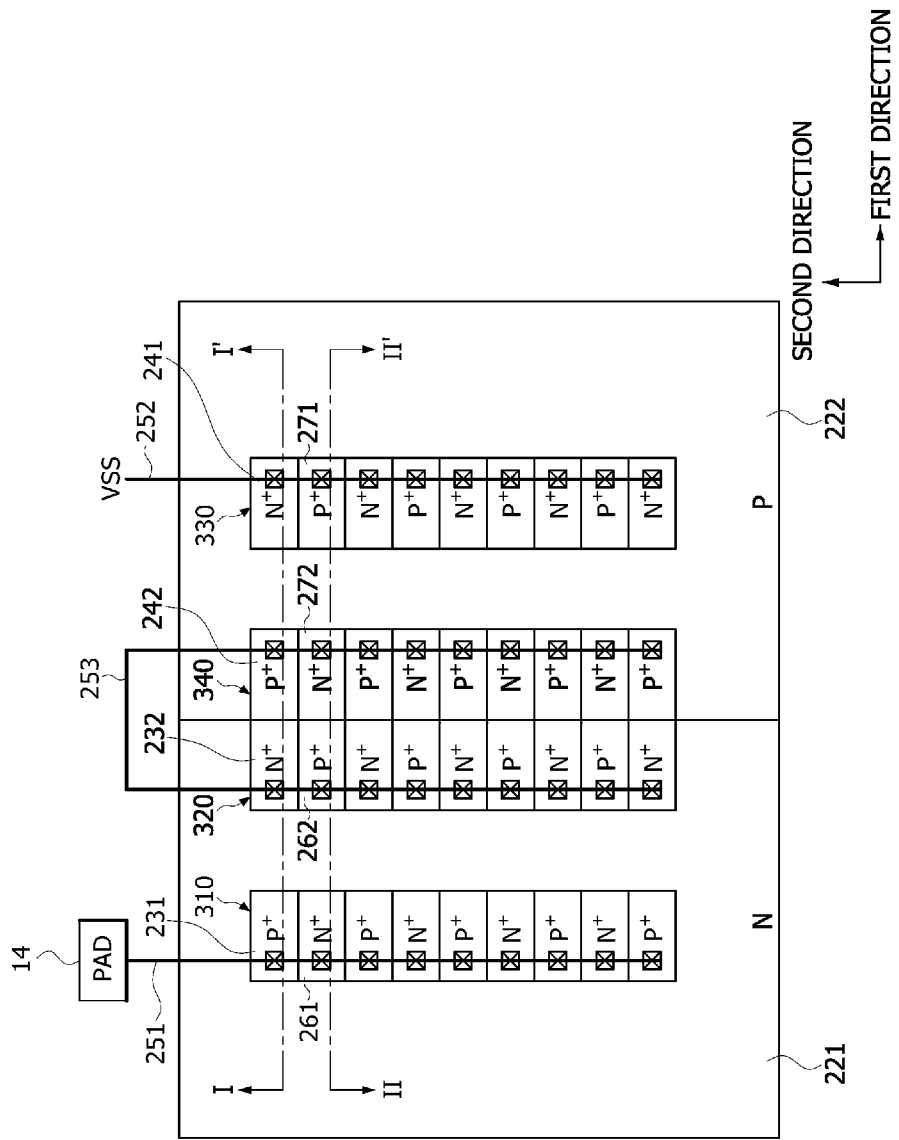
FIG. 5 is a layout diagram of the ESD protection device shown in FIG. 2.

FIG. 5 is a layout diagram of the ESD protection device 200 shown in FIG. 2. The cross-sectional view of FIG. 2 is consistent with a cross-sectional view taken along a line I-I' of FIG. 5.

Referring to FIG. 5, the N-type well region 221 and the P-type well region 222 may be disposed so that a sidewall of the N-type well region 221 is in contact with a sidewall of the P-type well region 222 to provide a PN junction between the N-type well region 221 and the P-type well region 222.

A first junction segment 310 and a second junction segment 320 may be disposed in the N-type well region 221. The first junction segment 310 and the second junction segment 320 may be disposed spaced apart from each other in a first direction such as, a horizontal direction. Each of the first and second junction segments 310 and 320 may have a stripe shape extending in a second direction such as, a vertical direction which is perpendicular to the first direction. A sidewall of the second junction segment 320 opposite to the first junction segment 310 may overlap with a contact sidewall that is, PN junction of the N-type well region 221 and the P-type well region 222.

A third junction segment 330 and a fourth junction segment 340 may be disposed in the P-type well region 222. The third junction segment 330 and the fourth junction segment 340 may be disposed spaced apart from each other in the first direction. Each of the third and fourth junction segments 330 and 340 may have a stripe shape extending in the second direction. A sidewall of the fourth junction segment 340 opposite to the third junction segment 330 may overlap with the contact sidewall that is, PN junction of the N-type well region 221 and the P-type well region 222. Accordingly, a sidewall of the fourth junction segment 340 may contact a sidewall of the second junction segment 320.

The first junction segment 310 may include the plurality of first P-type junction regions 231 and a plurality of third N-type junction regions 261 which are alternately arrayed in the second direction. As illustrated in FIG. 5, if two of the first P-type junction regions 231 are respectively disposed at both ends of the first junction segment 310, the third N-type junction regions 261 may be disposed between the first P-type junction regions 231. All of the first P-type junction regions 231 and all of the third N-type junction regions 261 may be connected to the pad 14 through the first signal line 251.

The second junction segment 320 may also include the plurality of first N-type junction regions 232 and a plurality of third P-type junction regions 262 which are alternately arrayed in the second direction. The number of the junction regions 232 and 262 constituting the second junction segment 320 may be equal to the number of the junction regions 231 and 261 constituting the first junction segment 310.

The first N-type junction regions 232 of the second junction segment 320 may be disposed to face the first P-type junction regions 231 of the first junction segment 310 in the first direction, respectively. Similarly, the third P-type junction regions 262 of the second junction segment 320 may be disposed to face the third N-type junction regions 261 of the first junction segment 310 in the first direction, respectively. Accordingly, as illustrated in FIG. 5, if two of the first P-type junction regions 231 are respectively disposed at both ends of the first junction segment 310, two of the first N-type junction regions 232 may be respectively disposed at both ends of the second junction segment 320 and the third P-type junction regions 262 may be disposed between the first N-type junction regions 232.

All of the first N-type junction regions 232 and all of the third P-type junction regions 262 may be connected to the connection line 253.

The third junction segment 330 may also include the plurality of second N-type junction regions 241 and a plurality of fourth P-type junction regions 271 which are alternately arrayed in the second direction. The number of the junction regions 241 and 271 constituting the third junction segment 330 may be equal to the number of the junction regions 231 and 261 constituting the first junction segment 310 or the number of the junction regions 232 and 262 constituting the second junction segment 320.

An array configuration of the junction regions 241 and 271 in the third junction segment 330 may be opposite to an array configuration of the junction regions 231 and 261 in the first junction segment 310. That is, as illustrated in FIG. 5, if two of the first P-type junction regions 231 are respectively disposed at both ends of the first junction segment 310, two of the second N-type junction regions 241 may be respectively disposed at both ends of the third junction segment 330 and the fourth P-type junction regions 271 may be disposed between the second N-type junction regions 241. All of the second N-type junction regions 241 and all of the fourth P-type junction regions 271 may be connected to the ground voltage VSS through the second signal line 252.

The fourth junction segment 340 may also include the plurality of second P-type junction regions 242 and a plurality of fourth N-type junction regions 272 which are alternately arrayed in the second direction. The number of the junction regions 242 and 272 constituting the fourth junction segment 340 may be equal to the number of the junction regions constituting the first junction segment 310, the second junction segment 320 or third junction segment 330.

The second P-type junction regions 242 of the fourth junction segment 340 may face the second N-type junction regions 241 of the third junction segment 330 in the first direction, respectively. Similarly, the fourth N-type junction regions 272 of the fourth junction segment 340 may face the fourth P-type junction regions 271 of the third junction segment 330 in the first direction, respectively. Thus, an array configuration of the junction regions 242 and 272 constituting the fourth junction segment 340 may be opposite to an array configuration of the junction regions 232 and 262 constituting the second junction segment 320. Accordingly, as illustrated in FIG. 5, if two of the first P-type junction regions 231 are respectively disposed at both ends of the first junction segment 310, two of the second P-type junction regions 242 may be respectively disposed at both ends of the fourth junction segment 340 and the fourth N-type junction regions 272 may be disposed between the second P-type junction regions 242.

All of the second P-type junction regions 242 and all of the fourth N-type junction regions 272 may be connected to the connection line 253. Thus, the junction regions 242 and 272 in the fourth junction segment 340 may contact the junction regions 232 and 262 in the second junction segment 320, respectively and may also be electrically connected to the junction regions 232 and 262 in the second junction segment 320 through the connection line 253.

As described with reference to FIG. 2 illustrating a cross-sectional view taken along a line I-I' of FIG. 5 and FIGS. 3 and 4 illustrating equivalent circuit diagrams of FIG. 2, if an ESD event occurs when the pad 14 has a voltage level higher than the ground voltage VSS, the first ESD current Iesd1 may flow along a first discharge current path provided by the first PN diode D1 comprised of the first P-type junction regions 231 and the N-type well region 221/the first N-type junction regions 232, the connection line 253 and the second PN diode D2 comprised of the second P-type junction regions 242/the P-type well region 222 and the second N-type junction regions 241.

In addition, if the first ESD current Iesd1 flows, the second ESD current Iesd2 may also flow along a second discharge current path provided by the PNPN structural SCR comprised of the first P-type junction regions 231, the N-type well region 221/the first N-type junction regions 232, the second P-type junction regions 242/the P-type well region 222, and the second N-type junction regions 241. Since the PNPN structural SCR is turned on by the first ESD current Iesd1 flowing through the first and second PN diodes D1 and D2, a trigger voltage of the ESD protection device 200 may be set to a sum of the cut-in voltages of the first and second PN diodes D1 and D2.

If the pad 14 has a voltage level lower than the ground voltage VSS, the ESD operation may be performed by another mechanism which is different from the above mentioned mechanism. The ESD operation when the pad 14 has a negative voltage level will be described hereinafter with reference to FIG. 6.

Figure 6:
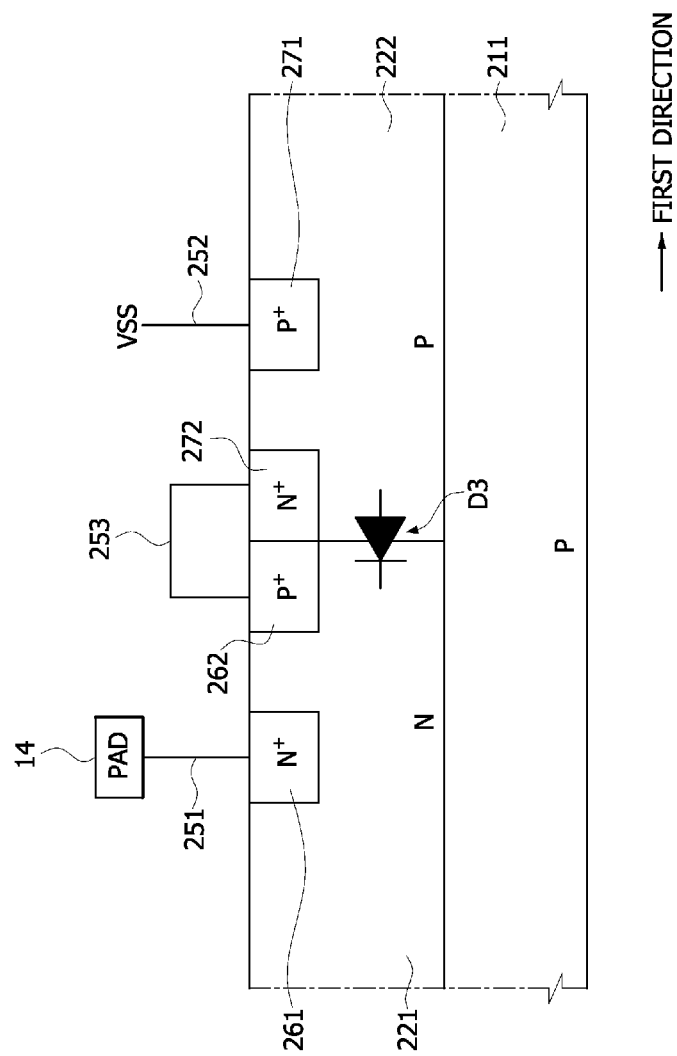
FIG. 6 is a cross-sectional view taken along a line II-II' of FIG. 5.

FIG. 6 is a cross-sectional view taken along a line II-II' of FIG. 5. In FIG. 6, the same reference numerals as used in FIGS. 2 and 5 denote the same elements.

Referring to FIG. 6, the third N-type junction region 261 and the third P-type junction region 262 may be disposed in an upper portion of the N-type well region 221 spaced apart from each other. The third N-type junction region 261 may be connected to the pad 14 through the first signal line 251. The fourth P-type junction region 271 and the fourth N-type junction region 272 may be disposed in an upper portion of the P-type well region 222 spaced apart from each other. The fourth P-type junction region 271 may be connected to the ground voltage VSS through the second signal line 252. A sidewall of the fourth N-type junction region 272 may be in direct contact with a sidewall of the third P-type junction region 262. That is, the fourth N-type junction region 272 and the third P-type junction region 262 may provide a parasitic PN diode. The fourth N-type junction region 272 and the third P-type junction region 262 may be electrically connected to each other by the connection line 253.

A third PN diode D3 may also be parasitically provided between the pad 14 and the ground voltage VSS. The third PN diode D3 may be comprised of the P-type well region 222/the fourth P-type junction region 271 and the N-type well region 221/the third N-type junction region 261. An anode of the third PN diode D3 may correspond to the P-type well region 222/the fourth P-type junction region 271, and a cathode of the third PN diode D3 may correspond to the N-type well region 221/the third N-type junction region 261. Accordingly, if a negative voltage lower than the ground voltage VSS is applied to the pad 14, an ESD current may flow from the ground voltage VSS towards the pad 14 through the third PN diode D3.

Figure 7:
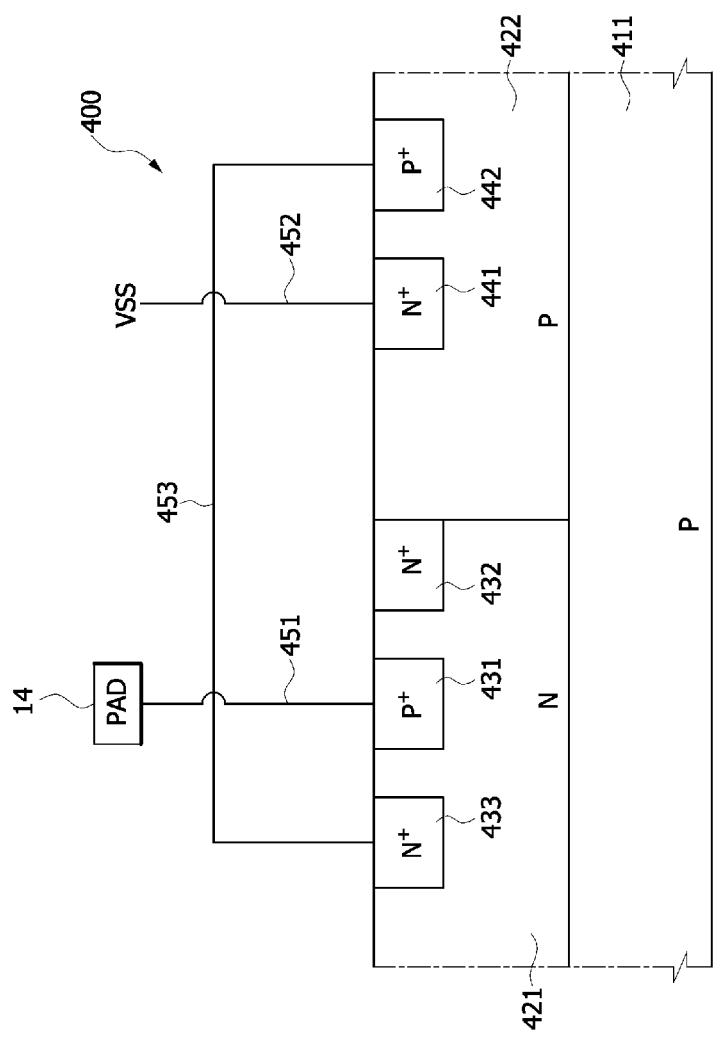
FIG. 7 is a cross-sectional view illustrating an ESD protection device according to another embodiment.

FIG. 7 is a cross-sectional view illustrating an ESD protection device 400 according to another embodiment.

Referring to FIG. 7, the ESD protection device 400 may include an N-type well region 421 and a P-type well region 422 which are disposed in an upper portion of a P-type substrate 411. A sidewall of the N-type well region 421 may contact a sidewall of the P-type well region 422 to provide a parasitic PN diode between the N-type well region 421 and the P-type well region 422.

A first P-type junction region 431, a first N-type junction region 432 and a second P-type junction region 433 may be disposed in an upper portion of the N-type well region 421 spaced apart from each other. In some embodiments, the first P-type junction region 431 may be disposed between the first N-type junction region 432 and the second P-type junction region 433. The first P-type junction region 431 may be connected to the pad 14 through a first signal line 451. A sidewall of the first N-type junction region 432 opposite to the first P-type junction region 431 may be aligned with a contact sidewall of the N-type well region 421 and the P-type well region 422. Thus, the first N-type junction region 432 may be in direct contact with the contact sidewall of the N-type well region 421 and the P-type well region 422.

A third N-type junction region 441 and a second P-type junction region 442 may be disposed in an upper portion of the P-type well region 422 spaced apart from each other. The third N-type junction region 441 may be connected to the ground voltage VSS through a second signal line 452. The second N-type junction region 433 may be electrically connected to the second P-type junction region 442 through a connection line 453.

The first P-type junction region 431, the N-type well region 421 and the first N-type junction region 432, the second P-type junction region 442 and the P-type well region 422, and the third N-type junction region 441 may constitute an SCR having a PNPN junction structure coupled between the first and second signal lines 451 and 452, that is, between the pad 14 and the ground voltage VSS.

The first P-type junction region 431 and the N-type well region 421/the second N-type junction region 433 may constitute a first PN diode. The second P-type junction region 442/the P-type well region 422 and the third N-type junction region 441 may constitute a second PN diode. A cathode that is, the second N-type junction region 433 of the first PN diode may be connected to an anode that is, the second P-type junction region 442 of the second PN diode through the connection line 453.

Figure 8:
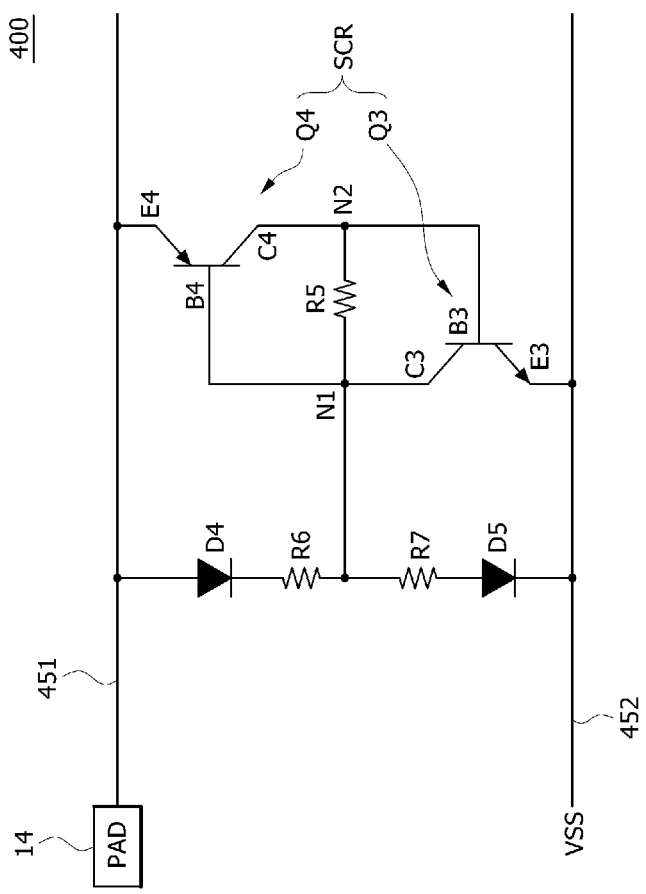
FIG. 8 is an equivalent circuit diagram of the ESD protection device shown in FIG. 7.

FIG. 8 is an equivalent circuit diagram of the ESD protection device 400 shown in FIG. 7.

Referring to FIGS. 7 and 8, the PNPN structural SCR may be coupled between the first signal line 451 connected to the pad 14 and the second signal line 452 connected to the ground voltage VSS. The PNPN structural SCR may include an NPN BJT Q3 and a PNP BJT Q4. A collector C3 of the NPN BJT Q3 may be connected to a base B4 of the PNP BJT Q4 through a first node N1. A base B3 of the NPN BJT Q3 may be connected to a collector C4 of the PNP BJT Q4 through a second node N2. An emitter E3 of the NPN BJT Q3 may be connected to the ground voltage VSS through the second signal line 452. An emitter E4 of the PNP BJT Q4 may be connected to the pad 14 through the first signal line 451. A resistive element R5 corresponding to the connection line 453 may be coupled between the first node N1 and the second node N2.

The emitter E4, the base B4, and the collector C4 of the PNP BJT Q4 may correspond to the first P-type junction region 431, the N-type well region 421/the second N-type junction region 433, and the second P-type junction region 442/the P-type well region 422, respectively. The collector C3, the base B3, and the emitter E3 of the NPN BJT Q3 may correspond to the N-type well region 221/the second N-type junction region 433, the second P-type junction region 442/the P-type well region 422, and the third N-type junction region 441, respectively.

A first PN diode D4 and a second PN diode D5 may be coupled in series between the first signal line 451 and the second signal line 452. An anode of the first PN diode D4 may be connected to the first signal line 451. A cathode of the first PN diode D4 may be connected to the first node N1 through a resistive element R6. An anode of the second PN diode D5 may be connected to the first node N1 through a resistive element R7. A cathode of the second PN diode D5 may be connected to the second signal line 452. A sum of resistance values of the resistive elements R6 and R7 coupled in series between the cathode of the first PN diode D4 and the anode of the second PN diode D5 may correspond to a resistance value of the connection line 453. The anode of the first PN diode D4 may correspond to the first P-type junction region 431, and the cathode of the first PN diode D4 may correspond to the N-type well region 421/the second N-type junction region 433. The anode of the second PN diode D5 may correspond to the second P-type junction region 442/the P-type well region 422, and the cathode of the second PN diode D5 may correspond to the third N-type junction region 441.

An operation of the ESD protection device 400 may be substantially the same as the operation of the ESD protection 200 discussed with reference to FIG. 4. That is, if an ESD event occurs at the pad 14, a first ESD current may flow from the pad 14 toward the ground voltage VSS through the first and second PN diodes D4 and D5. The first ESD current may flow through a first discharge current path comprised of the first P-type junction region 431, the N-type well region 421, the second N-type junction region 433, the connection line 453, the second P-type junction region 442, the P-type well region 422 and the third N-type junction region 441. The ESD operation generating the first ESD current flowing through the first discharge current path may be performed if a voltage applied to the pad 14 is higher than a trigger voltage corresponding to a sum of cut-in voltages for example, threshold voltages of the first and second PN diodes D4 and D5 coupled in series between the first and second signal lines 451 and 452.

If the first and second PN diodes D4 and D5 are turned on to generate the first ESD current flowing through the first discharge current path, voltage levels of the N-type well region 421 and the P-type well region 422 may be boosted higher than the ground voltage VSS. That is, the first and second nodes N1 and N2 may have voltage levels which are higher than the ground voltage VSS. In such a case, the PNPN structural SCR comprised of the NPN BJT Q3 and the PNP BJT Q4 may be turned on to provide a short circuit between the pad 14 and the ground voltage VSS. Accordingly, a second ESD current may flow from the pad 14 toward the ground voltage VSS through the PNPN structural SCR which is turned on.

Figure 9:
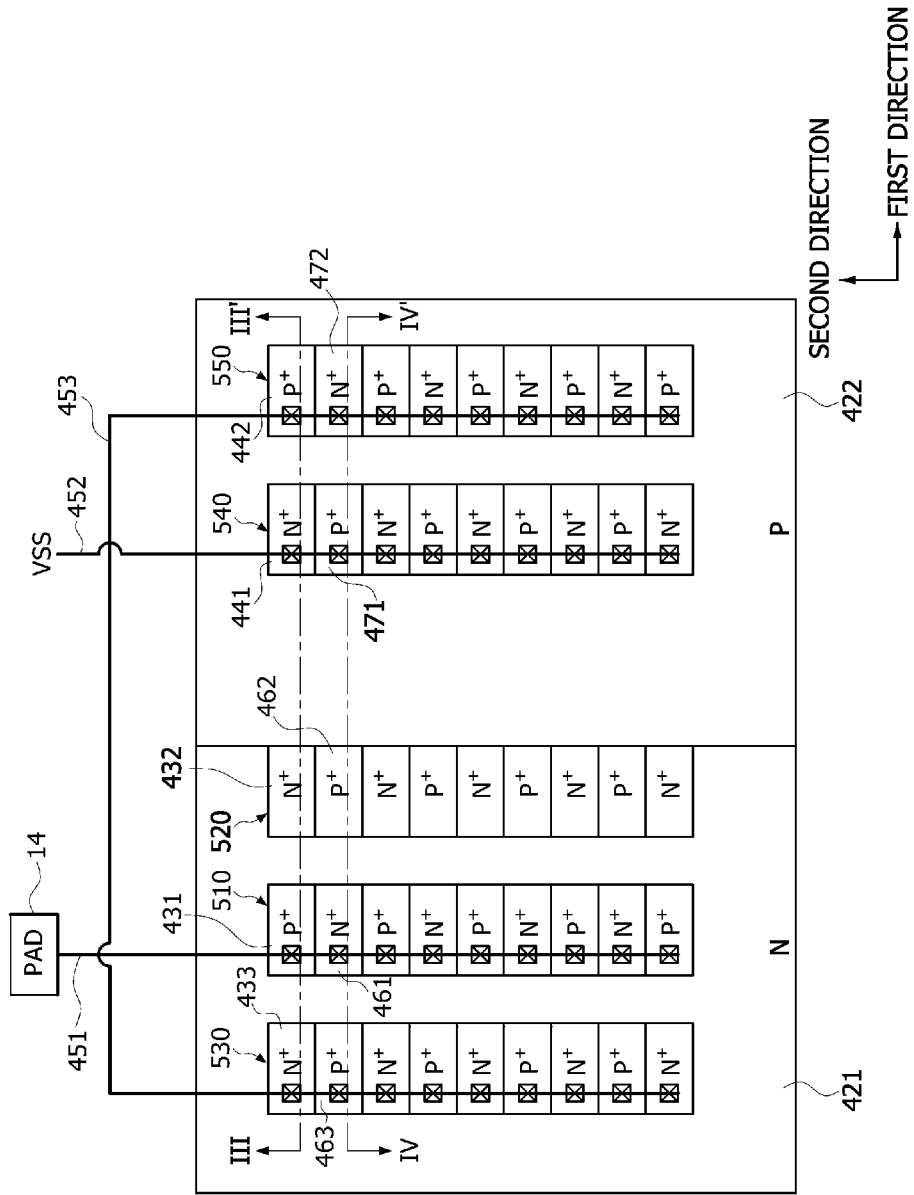
FIG. 9 is a layout diagram of the ESD protection device shown in FIG. 7.

FIG. 9 is a layout diagram of the ESD protection device 400 shown in FIG. 7. The cross-sectional view of FIG. 7 is consistent with a cross-sectional view taken along a line III-III' of FIG. 9.

Referring to FIG. 9, the N-type well region 421 and the P-type well region 422 may be disposed so that a sidewall of the N-type well region 421 is in contact with a sidewall of the P-type well region 422 to provide a PN junction between the N-type well region 421 and the P-type well region 422.

A first junction segment 510, a second junction segment 520 and a third junction segment 530 may be disposed in the N-type well region 421. The first junction segment 510, the second junction segment 520 and the third junction segment 530 may be disposed spaced apart from each other in a first direction such as, a horizontal direction. The first junction segment 510 may be disposed between the second and third junction segments 520 and 530. Each of the first, second and third junction segments 510, 520 and 530 may have a stripe shape extending in a second direction such as, a vertical direction which is perpendicular to the first direction. A sidewall of the second junction segment 520 opposite to the first junction segment 510 may overlap with a contact sidewall that is, PN junction of the N-type well region 421 and the P-type well region 422. Thus, the second junction segment 520 may be in direct contact with a sidewall of the P-type well region 422.

A fourth junction segment 540 and a fifth junction segment 550 may be disposed in the P-type well region 422. The fourth junction segment 540 and the fifth junction segment 550 may be disposed spaced apart from each other in the first direction. The fourth junction segment 540 may be disposed between the second junction segment 520 and the fifth junction segment 550. The fourth junction segment 540 may be spaced apart from the contact sidewall that is, PN junction of the N-type well region 421 and the P-type well region 422. Each of the fourth and fifth junction segments 540 and 550 may have a stripe shape extending in the second direction.

The first junction segment 510 may include the plurality of first P-type junction regions 431 and a plurality of fourth N-type junction regions 461 which are alternately arrayed in the second direction. As illustrated in FIG. 9, if two of the first P-type junction regions 431 are respectively disposed at both ends of the first junction segment 510, the fourth N-type junction regions 461 may be disposed between the first P-type junction regions 431. All of the first P-type junction regions 431 and all of the fourth N-type junction regions 461 may be connected to the pad 14 through the first signal line 451.

The second junction segment 520 may also include the plurality of first N-type junction regions 432 and a plurality of third P-type junction regions 462 which are alternately arrayed in the second direction. The number of the junction regions 432 and 462 constituting the second junction segment 520 may be equal to the number of the junction regions 431 and 461 constituting the first junction segment 510.

An array configuration of the junction regions 432 and 462 in the second junction segment 520 may be opposite to an array configuration of the junction regions 431 and 461 in the first junction segment 510. That is, the first N-type junction regions 432 of the second junction segment 520 may face the first P-type junction regions 431 of the first junction segment 510 in the first direction, respectively. Similarly, the third P-type junction regions 462 of the second junction segment 520 may face the fourth N-type junction regions 461 of the first junction segment 510 in the first direction, respectively. Accordingly, as illustrated in FIG. 9, if two of the first P-type junction regions 431 are respectively disposed at both ends of the first junction segment 510, two of the first N-type junction regions 432 may be respectively disposed at both ends of the second junction segment 520 and the third P-type junction regions 462 may be disposed between the first N-type junction regions 432.

The plurality of first N-type junction regions 432 and the plurality of third P-type junction regions 462 may be floated.

The third junction segment 530 may also include the plurality of second N-type junction regions 433 and a plurality of fourth P-type junction regions 463 which are alternately arrayed in the second direction. The number of the junction regions 433 and 463 constituting the third junction segment 530 may be equal to the number of the junction regions 431 and 461 or 432 and 462 constituting the first junction segment 510 or the second junction segment 520.

An array configuration of the junction regions 433 and 463 in the third junction segment 530 may be the same as an array configuration of the junction regions 432 and 462 in the second junction segment 520 and may be opposite to an array configuration of the junction regions 431 and 461 in the first junction segment 510. That is, the second N-type junction regions 433 of the third junction segment 530 may face the first P-type junction regions 431 of the first junction segment 510 in the first direction, respectively. Similarly, the fourth P-type junction regions 463 of the third junction segment 530 may face the fourth N-type junction regions 461 of the first junction segment 510 in the first direction, respectively. That is, as illustrated in FIG. 9, if two of the first P-type junction regions 431 are respectively disposed at both ends of the first junction segment 510, two of the second N-type junction regions 433 may be respectively disposed at both ends of the third junction segment 530 and the fourth P-type junction regions 463 may be disposed between the second N-type junction regions 433.

The second N-type junction regions 433 and the fourth P-type junction regions 463 may be connected to the connection line 453.

The fourth junction segment 540 may also include the plurality of third N-type junction regions 441 and a plurality of fifth P-type junction regions 471 which are alternately arrayed in the second direction. The number of the junction regions 441 and 471 constituting the fourth junction segment 540 may be equal to the number of the junction regions constituting each of the first, second and third junction segments 510, 520 and 530.

An array configuration of the junction regions 441 and 471 constituting the fourth junction segment 540 may be opposite to an array configuration of the junction regions 431 and 461 constituting the first junction segment 510. Accordingly, as illustrated in FIG. 9, if two of the first P-type junction regions 431 are respectively disposed at both ends of the first junction segment 510, two of the third N-type junction regions 441 may be respectively disposed at both ends of the fourth junction segment 540 and the fifth P-type junction regions 471 may be disposed between the third N-type junction regions 441.

All of the third N-type junction regions 441 and all of the fifth P-type junction regions 471 may be connected to the ground voltage VSS through the second signal line 452.

The fifth junction segment 550 may also include the plurality of second P-type junction regions 442 and a plurality of fifth N-type junction regions 472 which are alternately arrayed in the second direction. The number of the junction regions 442 and 472 constituting the fifth junction segment 550 may be equal to the number of the junction regions constituting each of the first, second, third and fourth junction segments 510, 520, 530 and 540.

An array configuration of the junction regions 442 and 472 constituting the fifth junction segment 550 may be the same as an array configuration of the junction regions 431 and 461 constituting the first junction segment 510 and may be opposite to an array configuration of the junction regions 441 and 471 constituting the fourth junction segment 540. That is, the second P-type junction regions 442 of the fifth junction segment 550 may face the third N-type junction regions 441 of the fourth junction segment 540 in the first direction, respectively. Similarly, the fifth N-type junction regions 472 of the fifth junction segment 550 may face the fifth P-type junction regions 471 of the fourth junction segment 540 in the first direction, respectively. Accordingly, as illustrated in FIG. 9, if two of the first P-type junction regions 431 are respectively disposed at both ends of the first junction segment 510, two of the second P-type junction regions 442 may be respectively disposed at both ends of the fifth junction segment 550 and the fifth N-type junction regions 472 may be disposed between the second P-type junction regions 442.

The junction regions 442 and 472 in the fifth junction segment 550 may be connected to the connection line 453. Thus, the junction regions 442 and 472 in the fifth junction segment 550 may be electrically connected to the junction regions 433 and 463 in the third junction segment 530 through the connection line 453.

As described with reference to FIG. 7 illustrating a cross-sectional view taken along a line III-III' of FIG. 9 and FIG. 8 illustrating an equivalent circuit diagram of FIG. 7, if an ESD event occurs when the pad 14 has a voltage level higher than the ground voltage VSS, the first ESD current may flow along a first discharge current path provided by the first PN diode D4 comprised of the first P-type junction regions 431 and the N-type well region 421/the second N-type junction regions 433, the connection line 453 and the second PN diode D5 comprised of the second P-type junction regions 442/the P-type well region 422 and the third N-type junction regions 441.

In addition, if the first ESD current flows through the first discharge current path, the second ESD current may also flow along a second discharge current path provided by the PNPN structural SCR comprised of the first P-type junction regions 431, the N-type well region 421/the second N-type junction regions 433, the P-type well region 422, and the third N-type junction regions 441. Since the PNPN structural SCR is turned on by the first ESD current flowing through the first and second PN diodes D4 and D5, a trigger voltage of the ESD protection device 400 may be set to a sum of the cut-in voltages of the first and second PN diodes D4 and D5.

If the pad 14 has a voltage level lower than the ground voltage VSS, the ESD operation may be performed by another mechanism which is different from the above mentioned mechanism. The ESD operation when the pad 14 has a negative voltage level will be described hereinafter with reference to FIG. 10.

Figure 10:
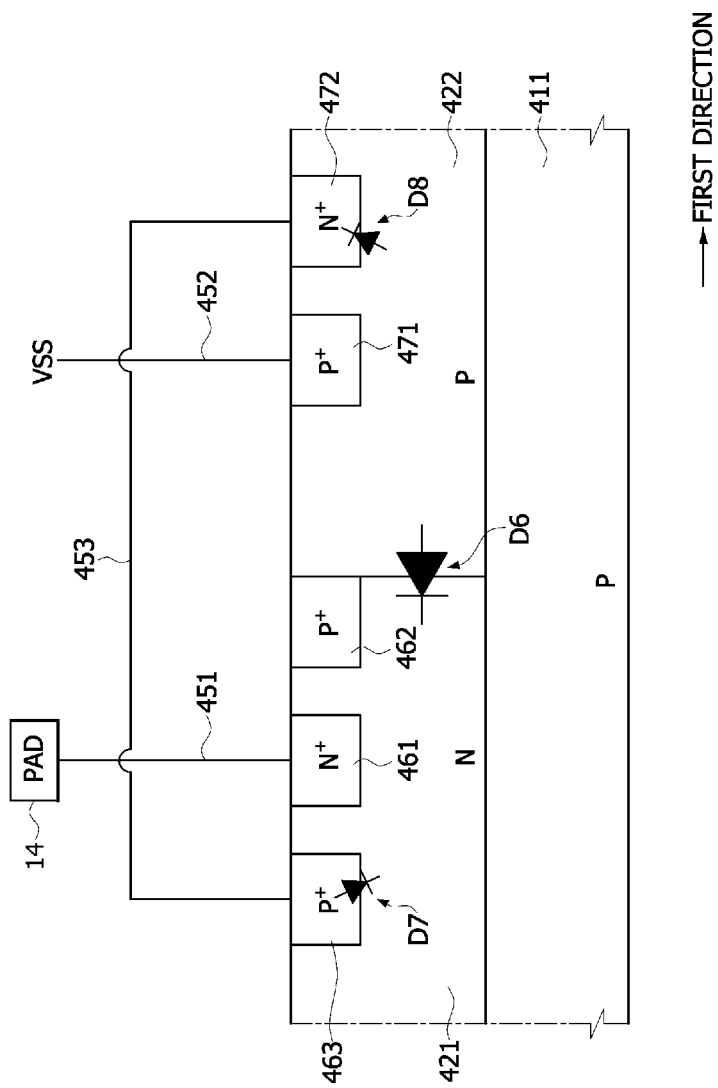
FIG. 10 is a cross-sectional view taken along a line IV-IV' of FIG. 9.

FIG. 10 is a cross-sectional view taken along a line IV-IV' of FIG. 9. In FIG. 10, the same reference numerals as used in FIGS. 7 and 9 denote the same elements.

Referring to FIG. 10, the fourth N-type junction region 461, the third P-type junction region 462 and the fourth P-type junction region 463 may be disposed in an upper portion of the N-type well region 421 spaced apart from each other. The fourth N-type junction region 461 may be connected to the pad 14 through the first signal line 451. A sidewall of the third P-type junction region 462 opposite to the fourth N-type junction region 461 may be in direct contact with a contact sidewall of the N-type well region 421 and the P-type well region 422. The fourth P-type junction region 463 may be connected to the connection line 453. The fifth P-type junction region 471 and the fifth N-type junction region 472 may be disposed in an upper portion of the P-type well region 422 spaced apart from each other. The fifth P-type junction region 471 may be connected to the ground voltage VSS through the second signal line 452. The fifth N-type junction region 472 may be connected to the fourth P-type junction region 463 through the connection line 453.

A third PN diode D6, a fourth PN diode D7 and a fifth PN diode D8 may be parasitically provided between the pad 14 and the ground voltage VSS. The third PN diode D6 may be comprised of the P-type well region 422/the fifth P-type junction region 471 and the N-type well region 421/the fourth N-type junction region 461. An anode of the third PN diode D6 may correspond to the P-type well region 422/the fifth P-type junction region 471. A cathode of the third PN diode D6 may correspond to the N-type well region 421/the fourth N-type junction region 461. The fourth PN diode D7 may be comprised of the fourth P-type junction region 463 and the N-type well region 421. The fifth PN diode D8 may be comprised of the P-type well region 422 and the fifth N-type junction region 472. Accordingly, if a negative voltage lower than the ground voltage VSS is applied to the pad 14, an ESD current may flow from the ground voltage VSS toward the pad 14 through the third PN diode D6. In addition, if the negative voltage is applied to the pad 14, the ESD current may also flow from the ground voltage VSS toward the pad 14 through the fifth PN diode D8, the connection line 453 and the fourth PN diode D7.

Figure 11:
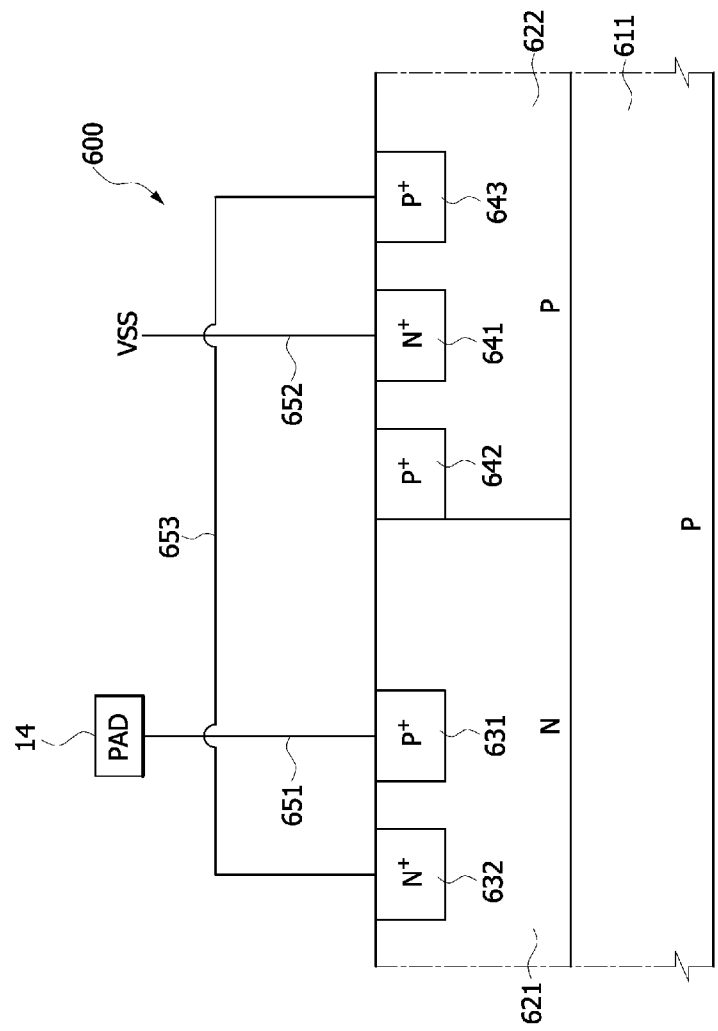
FIG. 11 is a cross-sectional view illustrating an ESD protection device according to yet another embodiment.

FIG. 11 is a cross-sectional view illustrating an ESD protection device 600 according to yet another embodiment.

Referring to FIG. 11, the ESD protection device 600 may include an N-type well region 621 and a P-type well region 622 which are disposed in an upper portion of a P-type substrate 611. A sidewall of the N-type well region 621 may contact a sidewall of the P-type well region 622 to provide a parasitic PN diode between the N-type well region 621 and the P-type well region 622.

A first P-type junction region 631 and a first N-type junction region 632 may be disposed in an upper portion of the N-type well region 621 spaced apart from each other. The first P-type junction region 631 may be connected to the pad 14 through a first signal line 651.

A second N-type junction region 641, a second P-type junction region 642 and a third P-type junction region 643 may be disposed in an upper portion of the P-type well region 622 spaced apart from each other. In some embodiments, the second N-type junction region 641 may be disposed between the second P-type junction region 642 and the third P-type junction region 643. The second N-type junction region 641 may be connected to the ground voltage VSS through a second signal line 652. A sidewall of the second P-type junction region 642 opposite to the second N-type junction region 641 may be aligned with a contact sidewall of the N-type well region 621 and the P-type well region 622. Thus, the second P-type junction region 642 may be in direct contact with the contact sidewall of the N-type well region 621 and the P-type well region 622. The third P-type junction region 643 may be electrically connected to the first N-type junction region 632 through the connection line 653.

The first P-type junction region 631, the N-type well region 621/the first N-type junction region 632, the third P-type junction region 643/the P-type well region 622, and the second N-type junction region 641 may constitute an SCR having a PNPN junction structure coupled between the first and second signal lines 651 and 652, that is, between the pad 14 and the ground voltage VSS.

The first P-type junction region 631 and the N-type well region 621/the first N-type junction region 632 may constitute a first PN diode. The third P-type junction region 643/the P-type well region 622 and the second N-type junction region 641 may constitute a second PN diode. A cathode such as, the first N-type junction region 632 of the first PN diode may be connected to an anode such as, the third P-type junction region 643 of the second PN diode through the connection line 653.

Figure 12:
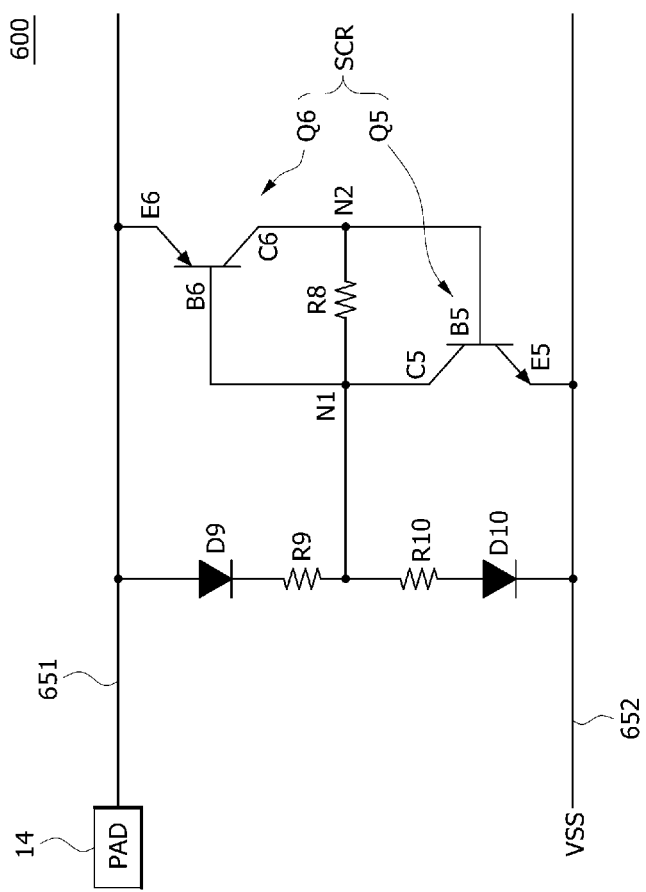
FIG. 12 is an equivalent circuit diagram of the ESD protection device shown in FIG. 11.

FIG. 12 is an equivalent circuit diagram of the ESD protection device 600 shown in FIG. 11.

Referring to FIGS. 11 and 12, the PNPN structural SCR may be coupled between the first signal line 651 connected to the pad 14 and the second signal line 652 connected to the ground voltage VSS. The PNPN structural SCR may include an NPN BJT Q5 and a PNP BJT Q6. A collector C5 of the NPN BJT Q5 may be connected to a base B6 of the PNP BJT Q6 through a first node N1. A base B5 of the NPN BJT Q5 may be connected to a collector C6 of the PNP BJT Q6 through a second node N2. An emitter E5 of the NPN BJT Q5 may be connected to the ground voltage VSS through the second signal line 652. An emitter E6 of the PNP BJT Q6 may be connected to the pad 14 through the first signal line 651. A resistive element R8 corresponding to the connection line 653 may be coupled between the first node N1 and the second node N2.

The emitter E6, the base B6, and the collector C6 of the PNP BJT Q6 may correspond to the first P-type junction region 631, the N-type well region 621, and the third P-type junction region 643/the P-type well region 622, respectively. The collector C5, the base B5, and the emitter E5 of the NPN BJT Q5 may correspond to the N-type well region 621/the first N-type junction region 632, the third P-type junction region 643/the P-type well region 622, and the second N-type junction region 641, respectively.

A first PN diode D9 and a second PN diode D10 may be coupled in series between the first signal line 651 and the second signal line 652. An anode of the first PN diode D9 may be connected to the first signal line 651. A cathode of the first PN diode D9 may be connected to the first node N1 through a resistive element R9. An anode of the second PN diode D10 may be connected to the first node N1 through a resistive element R10. A cathode of the second PN diode D10 may be connected to the second signal line 652. A sum of resistance values of the resistive elements R9 and R10 coupled in series between the cathode of the first PN diode D9 and the anode of the second PN diode D10 may correspond to a resistance value of the connection line 653. The anode of the first PN diode D9 may correspond to the first P-type junction region 631, and the cathode of the first PN diode D9 may correspond to the N-type well region 621/the first N-type junction region 632. The anode of the second PN diode D10 may correspond to the third P-type junction region 643/the P-type well region 622, and the cathode of the second PN diode D10 may correspond to the second N-type junction region 641.

An operation of the ESD protection device 600 may be substantially the same as the operation of the ESD protection 200 discussed with reference to FIG. 4. That is, if an ESD event occurs at the pad 14, a first ESD current may flow from the pad 14 toward the ground voltage VSS through the first and second PN diodes D9 and D10. The first ESD current may flow through a first discharge current path comprised of the first P-type junction region 631, the N-type well region 621, the first N-type junction region 632, the connection line 653, the third P-type junction region 643, the P-type well region 622 and the second N-type junction region 641. The ESD operation generating the first ESD current flowing through the first discharge current path may be performed if a voltage applied to the pad 14 is higher than a trigger voltage corresponding to a sum of cut-in voltages that is, threshold voltages of the first and second PN diodes D9 and D10 coupled in series between the first and second signal lines 651 and 652.

If the first and second PN diodes D9 and D10 are turned on to generate the first ESD current flowing through the first discharge current path, voltage levels of the N-type well region 621 and the P-type well region 622 may be boosted higher than the ground voltage VSS. That is, the first and second nodes N1 and N2 may have voltage levels which are higher than the ground voltage VSS. In such a case, the PNPN structural SCR comprised of the NPN BJT Q5 and the PNP BJT Q6 may be turned on to provide a short circuit between the pad 14 and the ground voltage VSS. Accordingly, a second ESD current may flow from the pad 14 towards the ground voltage VSS through the PNPN structural SCR which is turned on.

Figure 13:
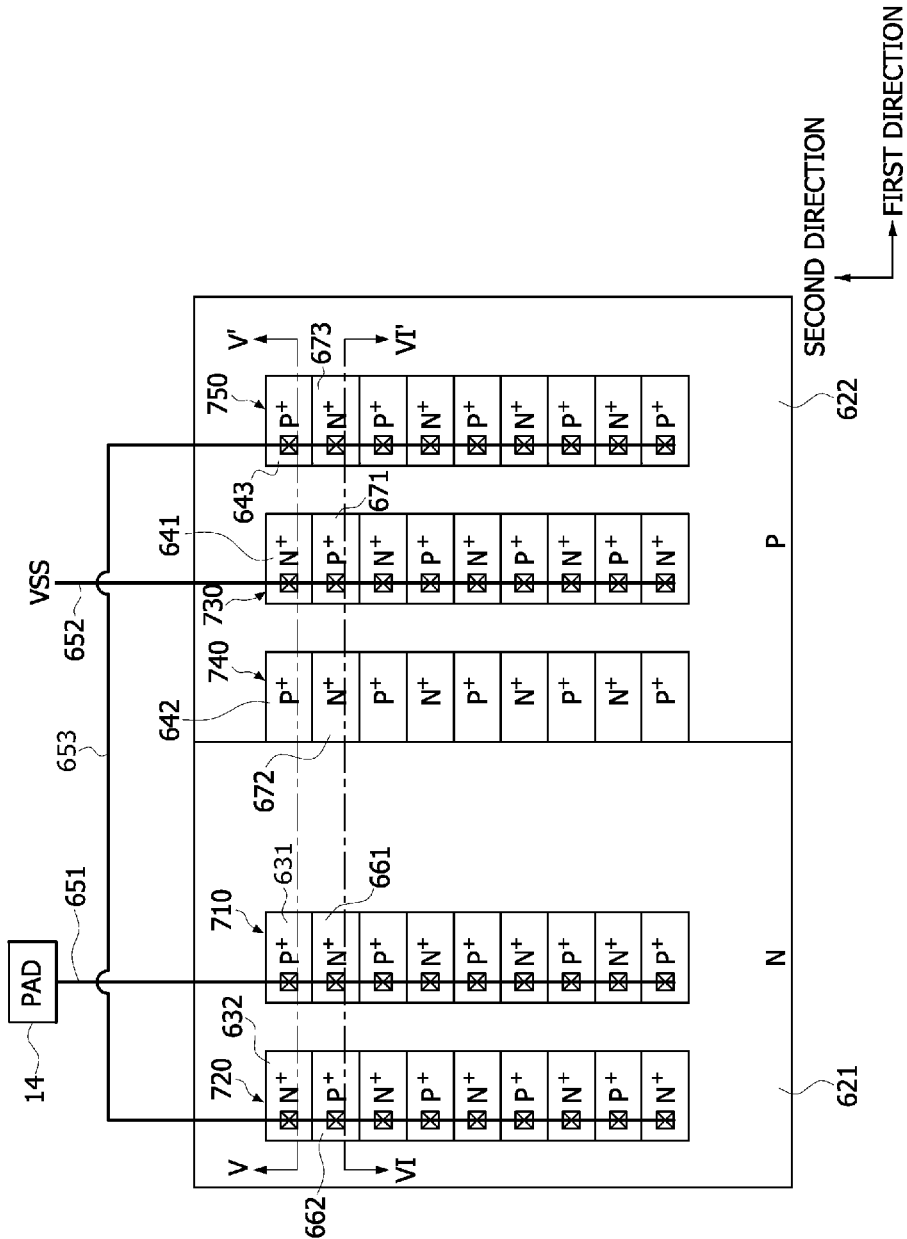
FIG. 13 is a layout diagram of the ESD protection device shown in FIG. 11.

FIG. 13 is a layout diagram of the ESD protection device 600 shown in FIG. 11. The cross-sectional view of FIG. 11 is consistent with a cross-sectional view taken along a line V-V' of FIG. 13.

Referring to FIG. 13, the N-type well region 621 and the P-type well region 622 may be disposed so that a sidewall of the N-type well region 621 contacts a sidewall of the P-type well region 622 to provide a PN junction between the N-type well region 621 and the P-type well region 622.

A first junction segment 710 and a second junction segment 720 may be disposed in the N-type well region 621. The first junction segment 710 and the second junction segment 720 may be spaced apart from each other in a first direction such as, a horizontal direction. The first junction segment 710 may be disposed between the second junction segment 720 and the P-type well region 622 in the first direction. The first junction segment 710 may be disposed spaced apart from the P-type well region 622. Each of the first and second junction segments 710 and 720 may have a stripe shape extending in a second direction for example, a vertical direction which is perpendicular to the first direction.

A third junction segment 730, a fourth junction segment 740 and a fifth junction segment 750 may be disposed in the P-type well region 622. The third junction segment 730, the fourth junction segment 740 and the fifth junction segment 750 may be disposed spaced apart from each other in the first direction. The third junction segment 730 may be disposed between the fourth and fifth junction segments 740 and 750. Each of the third, fourth and fifth junction segments 730, 740 and 750 may have a stripe shape extending in the second direction. A sidewall of the fourth junction segment 740 opposite to the third junction segment 730 may overlap with a contact sidewall that is, PN junction of the N-type well region 621 and the P-type well region 622. Thus, the fourth junction segment 740 may be in direct contact with the contact sidewall that is, PN junction of the N-type well region 621 and the P-type well region 622.

The first junction segment 710 may include the plurality of first P-type junction regions 631 and a plurality of third N-type junction regions 661 which are alternately arrayed in the second direction. As illustrated in FIG. 13, if two of the first P-type junction regions 631 are respectively disposed at both ends of the first junction segment 710, the third N-type junction regions 661 may be disposed between the first P-type junction regions 631. All of the first P-type junction regions 631 and all of the third N-type junction regions 661 may be connected to the pad 14 through the first signal line 651.

The second junction segment 720 may also include the plurality of first N-type junction regions 632 and a plurality of fourth P-type junction regions 662 which are alternately arrayed in the second direction. The number of the junction regions 632 and 662 constituting the second junction segment 720 may be equal to the number of the junction regions 631 and 661 constituting the first junction segment 710.

An array configuration of the junction regions 632 and 662 in the second junction segment 720 may be opposite to an array configuration of the junction regions 631 and 661 in the first junction segment 710. That is, the first N-type junction regions 632 of the second junction segment 720 may be disposed to face the first P-type junction regions 631 of the first junction segment 710 in the first direction, respectively. Similarly, the fourth P-type junction regions 662 of the second junction segment 720 may be disposed to face the third N-type junction regions 661 of the first junction segment 710 in the first direction, respectively. Accordingly, as illustrated in FIG. 13, if two of the first P-type junction regions 631 are respectively disposed at both ends of the first junction segment 710, two of the first N-type junction regions 632 may be respectively disposed at both ends of the second junction segment 720 and the fourth P-type junction regions 662 may be disposed between the first N-type junction regions 632.

The plurality of first N-type junction regions 632 and the plurality of fourth P-type junction regions 662 may be electrically connected to the connection line 653.

The third junction segment 730 may also include the plurality of second N-type junction regions 641 and a plurality of fifth P-type junction regions 671 which are alternately arrayed in the second direction. The number of the junction regions 641 and 671 constituting the third junction segment 730 may be equal to the number of the junction regions 631 and 661 or 632 and 662 constituting the first junction segment 710 or the second junction segment 720.

An array configuration of the junction regions 641 and 671 in the third junction segment 730 may be the same as an array configuration of the junction regions 632 and 662 in the second junction segment 720 and may be opposite to an array configuration of the junction regions 631 and 661 in the first junction segment 710. Thus, as illustrated in FIG. 13, if two of the first P-type junction regions 631 are respectively disposed at both ends of the first junction segment 710, two of the second N-type junction regions 641 may be respectively disposed at both ends of the third junction segment 730 and the fifth P-type junction regions 671 may be disposed between the second N-type junction regions 641.

The second N-type junction regions 641 and the fifth P-type junction regions 671 may be connected to the ground voltage VSS though the second signal line 652.

The fourth junction segment 740 may also include the plurality of second P-type junction regions 642 and a plurality of fourth N-type junction regions 672 which are alternately arrayed in the second direction. The number of the junction regions 642 and 672 constituting the fourth junction segment 740 may be equal to the number of the junction regions constituting each of the first, second and third junction segments 710, 720 and 730.

An array configuration of the junction regions 642 and 672 constituting the fourth junction segment 740 may be the same as an array configuration of the junction regions 631 and 661 in the first junction segment 710 and may be opposite to an array configuration of the junction regions 641 and 671 in the third junction segment 730. That is, the second P-type junction regions 642 of the fourth junction segment 740 may face the second N-type junction regions 641 of the third junction segment 730 in the first direction, respectively. Similarly, the fourth N-type junction regions 672 of the fourth junction segment 740 may face the fifth P-type junction regions 671 of the third junction segment 730 in the first direction, respectively. Accordingly, as illustrated in FIG. 13, if two of the first P-type junction regions 631 are respectively disposed at both ends of the first junction segment 710, two of the second P-type junction regions 642 may be respectively disposed at both ends of the fourth junction segment 740 and the fourth N-type junction regions 672 may be disposed between the second P-type junction regions 642.

All of the second P-type junction regions 642 and all of the fourth N-type junction regions 672 may be floated.

The fifth junction segment 750 may also include the plurality of third P-type junction regions 643 and a plurality of fifth N-type junction regions 673 which are alternately arrayed in the second direction. The number of the junction regions 643 and 673 constituting the fifth junction segment 750 may be equal to the number of the junction regions constituting each of the first, second, third and fourth junction segments 710, 720, 730 and 740.

An array configuration of the junction regions 643 and 673 constituting the fifth junction segment 750 may be the same as an array configuration of the junction regions 631 and 661 constituting the first junction segment 710 and may be opposite to an array configuration of the junction regions 641 and 671 constituting the third junction segment 730. That is, the third P-type junction regions 643 of the fifth junction segment 750 may face the second N-type junction regions 641 of the third junction segment 730 in the first direction, respectively. Similarly, the fifth N-type junction regions 673 of the fifth junction segment 750 may face the fifth P-type junction regions 671 of the third junction segment 730 in the first direction, respectively. Accordingly, as illustrated in FIG. 13, if two of the first P-type junction regions 631 are respectively disposed at both ends of the first junction segment 710, two of the third P-type junction regions 643 may be respectively disposed at both ends of the fifth junction segment 750 and the fifth N-type junction regions 673 may be disposed between the third P-type junction regions 643.

The junction regions 643 and 673 in the fifth junction segment 750 may be connected to the connection line 653. Thus, the junction regions 643 and 673 in the fifth junction segment 750 may be electrically connected to the junction regions 632 and 662 in the second junction segment 720 through the connection line 653.

As described with reference to FIG. 11 illustrating a cross-sectional view taken along a line V-V' of FIG. 13 and FIG. 12 illustrating an equivalent circuit diagram of FIG. 11, if an ESD event occurs when the pad 14 has a voltage level higher than the ground voltage VSS, the first ESD current may flow along a first discharge current path provided by the first PN diode D9 comprised of the first P-type junction regions 631 and the N-type well region 621/the first N-type junction regions 632, the connection line 653 and the second PN diode D10 comprised of the third P-type junction regions 643/the P-type well region 622 and the second N-type junction regions 641.

In addition, if the first ESD current flows through the first discharge current path, the second ESD current may also flow along a second discharge current path provided by the PNPN structural SCR comprised of the first P-type junction regions 631, the N-type well region 621, the P-type well region 622/the third P-type junction regions 643, and the second N-type junction regions 641. Since the PNPN structural SCR is turned on by the first ESD current flowing through the first and second PN diodes D9 and D10, a trigger voltage of the ESD protection device 600 may be set to a sum of the cut-in voltages of the first and second PN diodes D9 and D10.

If the pad 14 has a voltage level lower than the ground voltage VSS, the ESD operation may be performed by another mechanism which is different from the above mentioned mechanism. The ESD operation when the pad 14 has a negative voltage level will be described hereinafter with reference to FIG. 14.

Figure 14:
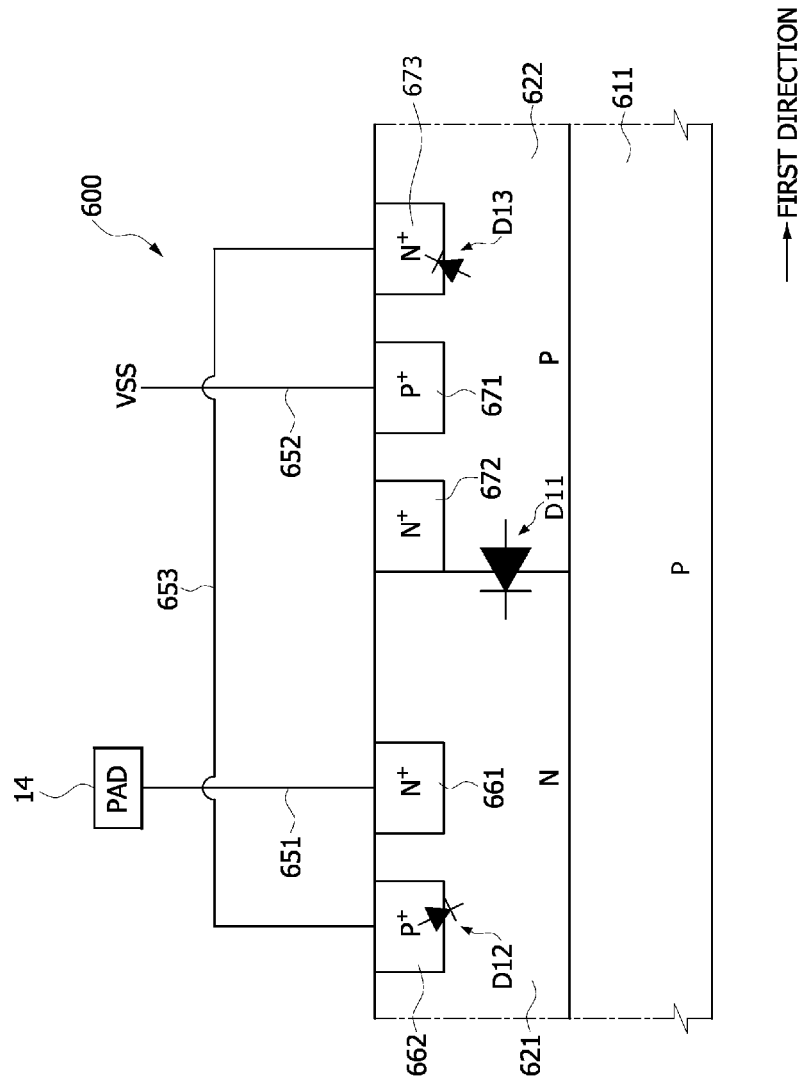
FIG. 14 is a cross-sectional view taken along a line VI-VI' of FIG. 13.

FIG. 14 is a cross-sectional view taken along a line VI-VI' of FIG. 13. In FIG. 14, the same reference numerals as used in FIGS. 11 and 13 denote the same elements.

Referring to FIG. 14, the third N-type junction region 661 and the fourth P-type junction region 662 may be disposed in an upper portion of the N-type well region 621 spaced apart from each other. The third N-type junction region 661 may be connected to the pad 14 through the first signal line 651. The fourth P-type junction region 662 may be connected to the connection line 653. The fifth P-type junction region 671, the fourth N-type junction region 672 and the fifth N-type junction region 673 may be disposed in an upper portion of the P-type well region 622 spaced apart from each other. The fifth P-type junction region 671 may be disposed between the fourth N-type junction region 672 and the fifth N-type junction region 673. The fifth P-type junction region 671 may be connected to the ground voltage VSS through the second signal line 652. A sidewall of the fourth N-type junction region 672 opposite to the fifth P-type junction region 671 may be in direct contact with a contact sidewall of the N-type well region 621 and the P-type well region 622. The fifth N-type junction region 673 may be connected to the fourth P-type junction region 662 through the connection line 653.

A third PN diode D11, a fourth PN diode D12 and a fifth PN diode D13 may be parasitically provided between the pad 14 and the ground voltage VSS. The third PN diode D11 may be comprised of the P-type well region 622/the fifth P-type junction region 671 and the N-type well region 621/the third N-type junction region 661. An anode of the third PN diode D11 may correspond to the P-type well region 622/the fifth P-type junction region 671. A cathode of the third PN diode D11 may correspond to the N-type well region 621/the third N-type junction region 661. The fourth PN diode D12 may be comprised of the fourth P-type junction region 662 and the N-type well region 621/the third N-type junction region 661. The fifth PN diode D13 may be comprised of the P-type well region 622/the fifth P-type junction region 671 and the fifth N-type junction region 673. Accordingly, if a negative voltage lower than the ground voltage VSS is applied to the pad 14, an ESD current may flow from the ground voltage VSS towards the pad 14 through the third PN diode D11. In addition, if the negative voltage is applied to the pad 14, the ESD current may also flow from the ground voltage VSS towards the pad 14 through the fifth PN diode D13, the connection line 653 and the fourth PN diode D12.

Figure 15:
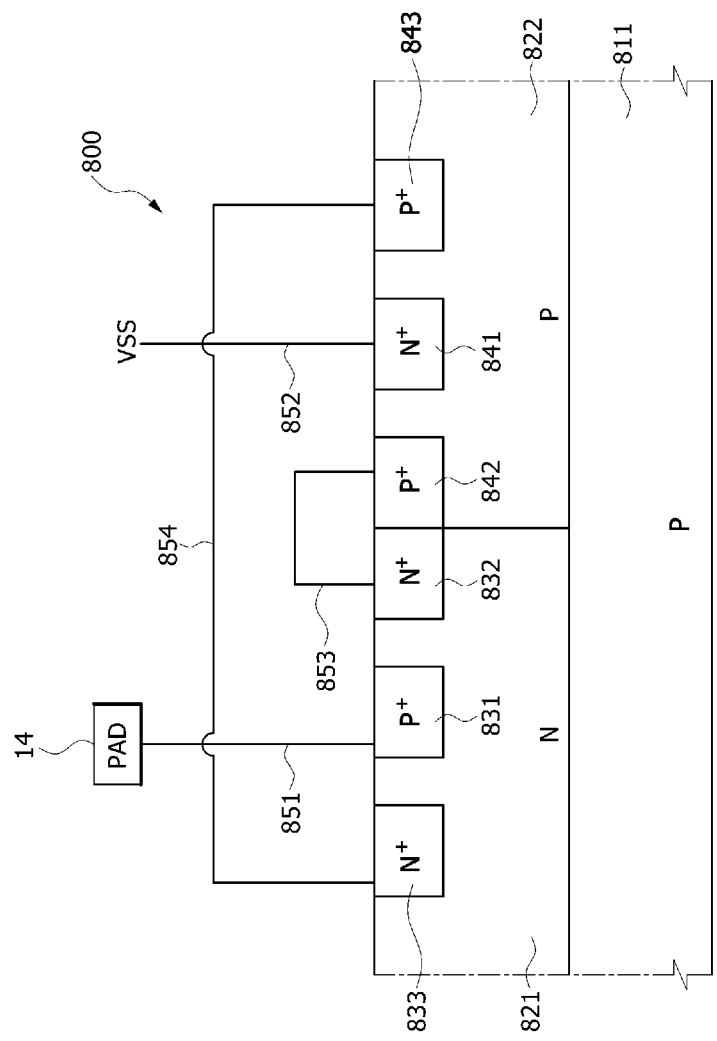
FIG. 15 is a cross-sectional view illustrating an ESD protection device according to still another embodiment.

FIG. 15 is a cross-sectional view illustrating an ESD protection device 800 according to still another embodiment.

Referring to FIG. 15, the ESD protection device 800 may include an N-type well region 821 and a P-type well region 822 which are disposed in an upper portion of a P-type substrate 811. A sidewall of the N-type well region 821 may contact a sidewall of the P-type well region 822 to provide a parasitic PN diode between the N-type well region 821 and the P-type well region 822.

A first P-type junction region 831, a first N-type junction region 832 and a second N-type junction region 833 may be disposed in an upper portion of the N-type well region 821 spaced apart from each other. In some embodiments, the first P-type junction region 831 may be disposed between the first N-type junction region 832 and the second N-type junction region 833. The first P-type junction region 831 may be connected to the pad 14 through a first signal line 851. A sidewall of the first N-type junction region 832 opposite to the first P-type junction region 831 may be aligned with a contact sidewall of the N-type well region 821 and the P-type well region 822.

A third N-type junction region 841, a second P-type junction region 842 and a third P-type junction region 843 may be disposed in an upper portion of the P-type well region 822 spaced apart from each other. In some embodiments, the third N-type junction region 841 may be disposed between the second P-type junction region 842 and the third P-type junction region 843. The third N-type junction region 841 may be connected to the ground voltage VSS through a second signal line 852. A sidewall of the second P-type junction region 842 opposite to the third N-type junction region 841 may be aligned with the contact sidewall of the N-type well region 821 and the P-type well region 822. Thus, the second P-type junction region 842 may be in direct contact with the first N-type junction region 832 at the contact sidewall of the N-type well region 821 and the P-type well region 822. The second P-type junction region 842 may be electrically connected to the first N-type junction region 832 through a first connection line 853, and the third P-type junction region 843 may be electrically connected to the second N-type junction region 833 through a second connection line 854.

The first P-type junction region 831, the N-type well region 821/the first N-type junction region 832, the second P-type junction region 842/the P-type well region 822, and the third N-type junction region 841 may constitute an SCR having a PNPN junction structure coupled between the first and second signal lines 851 and 852, that is, between the pad 14 and the ground voltage VSS.

The first P-type junction region 831 and the N-type well region 821/the first N-type junction region 832 may constitute a first PN diode. The second P-type junction region 842/the P-type well region 822 and the third N-type junction region 841 may constitute a second PN diode. A cathode that is, the first N-type junction region 832 of the first PN diode may be connected to an anode that is, the second P-type junction region 842 of the second PN diode through the first connection line 853.

The first P-type junction region 831 and the N-type well region 821/the second N-type junction region 833 may constitute a third PN diode. The third P-type junction region 843/the P-type well region 822 and the third N-type junction region 841 may constitute a fourth PN diode. A cathode that is, the second N-type junction region 833 of the third PN diode may be connected to an anode that is, the third P-type junction region 843 of the fourth PN diode through the second connection line 854.

Figure 16:
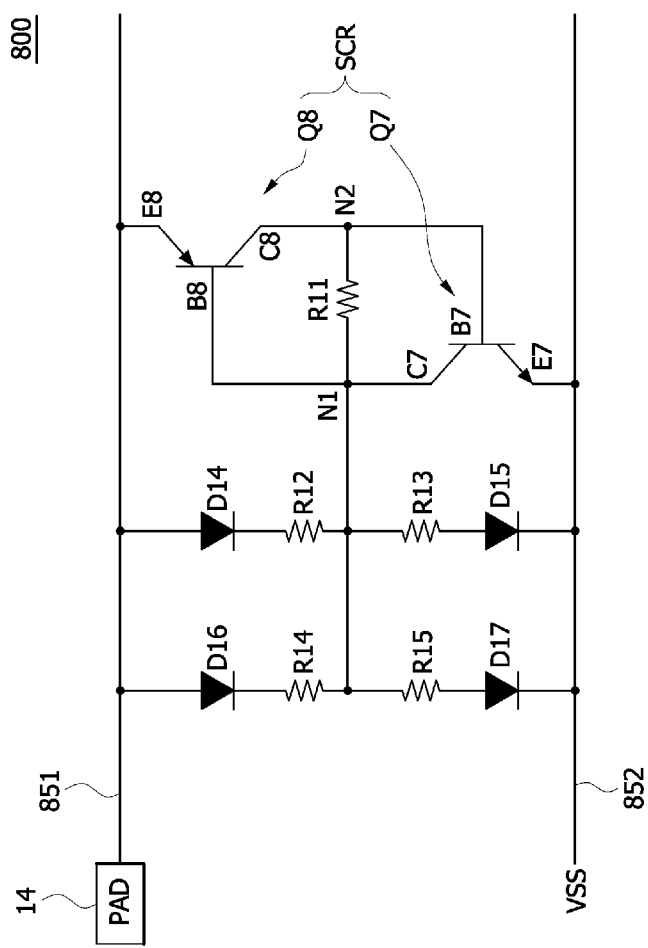
FIG. 16 is an equivalent circuit diagram of the ESD protection device shown in FIG. 15.

FIG. 16 is an equivalent circuit diagram of the ESD protection device 800 shown in FIG. 15.

Referring to FIGS. 15 and 16, the PNPN structural SCR may be coupled between the first signal line 851 connected to the pad 14 and the second signal line 852 connected to the ground voltage VSS. The PNPN structural SCR may include an NPN BJT Q7 and a PNP BJT Q8. A collector C7 of the NPN BJT Q7 may be connected to a base B8 of the PNP BJT Q8 through a first node N1. A base B7 of the NPN BJT Q7 may be connected to a collector C8 of the PNP BJT Q8 through a second node N2. An emitter E7 of the NPN BJT Q7 may be connected to the ground voltage VSS through the second signal line 852. An emitter E8 of the PNP BJT Q8 may be connected to the pad 14 through the first signal line 851. A resistive element R11 corresponding to the first connection line 853 may be coupled between the first node N1 and the second node N2.

The emitter E8, the base B8, and the collector C8 of the PNP BJT Q8 may correspond to the first P-type junction region 831, the N-type well region 821/the first N-type junction region 832, and the second P-type junction region 842/the P-type well region 822, respectively. The collector C7, the base B7, and the emitter E7 of the NPN BJT Q7 may correspond to the N-type well region 821/the first N-type junction region 832, the second P-type junction region 842/the P-type well region 822, and the third N-type junction region 841, respectively.

A first PN diode D14 and a second PN diode D15 may be coupled in series between the first signal line 851 and the second signal line 852. An anode of the first PN diode D14 may be connected to the first signal line 851. A cathode of the first PN diode D14 may be connected to the first node N1 through a resistive element R12. An anode of the second PN diode D15 may be connected to the first node N1 through a resistive element R13. A cathode of the second PN diode D15 may be connected to the second signal line 852. A sum of resistance values of the resistive elements R12 and R13 coupled in series between the cathode of the first PN diode D14 and the anode of the second PN diode D15 may correspond to a resistance value of the first connection line 853. The anode of the first PN diode D14 may correspond to the first P-type junction region 831, and the cathode of the first PN diode D14 may correspond to the N-type well region 821/the first N-type junction region 832. The anode of the second PN diode D15 may correspond to the second P-type junction region 842/the P-type well region 822, and the cathode of the second PN diode D15 may correspond to the third N-type junction region 841.

A third PN diode D16 and a fourth PN diode D17 may be coupled in series between the first signal line 851 and the second signal line 852. An anode of the third PN diode D16 may be connected to the first signal line 851. A cathode of the third PN diode D16 may be connected to the first node N1 through a resistive element R14. An anode of the fourth PN diode D17 may be connected to the first node N1 through a resistive element R15. A cathode of the fourth PN diode D17 may be connected to the second signal line 852. A sum of resistance values of the resistive elements R14 and R15 coupled in series between the cathode of the third PN diode D16 and the anode of the fourth PN diode D17 may correspond to a resistance value of the second connection line 854. The anode of the third PN diode D16 may correspond to the first P-type junction region 831, and the cathode of the third PN diode D16 may correspond to the N-type well region 821/the second N-type junction region 833. The anode of the fourth PN diode D17 may correspond to the third P-type junction region 843/the P-type well region 822, and the cathode of the fourth PN diode D17 may correspond to the third N-type junction region 841.

An operation of the ESD protection device 800 may be substantially the same as the operation of the ESD protection 200 discussed with reference to FIG. 4. That is, if an ESD event occurs at the pad 14, a portion of a first ESD current may flow from the pad 14 towards the ground voltage VSS through a first discharge current path provided by the first and second PN diodes D14 and D15. In addition, the other portion of the first ESD current may flow from the pad 14 towards the ground voltage VSS through a second ESD current path provided by the third and fourth PN diodes D16 and D17.

A portion of the first ESD current flowing through the first discharge current path and the other portion of the ESD current flowing through the second ESD current path may be simultaneously or separately generated. A portion of the first ESD current flowing through the first signal line 851 may flow towards the ground voltage VSS through the first discharge current path which is provided by the first PN diode D14 comprised of the first P-type junction region 831 and the N-type well region 821/the first N-type junction region 832, the first connection line 853, and the second PN diode D15 comprised of the second P-type junction region 842/the P-type well region 822 and the third N-type junction region 841. Moreover, the other portion of the first ESD current flowing through the first signal line 851 may flow towards the ground voltage VSS through the second ESD current path which is provided by the third PN diode D16 comprised of the first P-type junction region 831 and the N-type well region 821/the second N-type junction region 833, the second connection line 854, and the fourth PN diode D17 comprised of the third P-type junction region 843/the P-type well region 822 and the third N-type junction region 841.

The ESD operation generating a portion of the first ESD current flowing through the first discharge current path may be performed if a voltage applied to the pad 14 is higher than a trigger voltage corresponding to a sum of cut-in voltages that is, threshold voltages of the first and second PN diodes D14 and D15 coupled in series between the first and second signal lines 851 and 852.

In addition, the ESD operation generating the other portion of the first ESD current flowing through the second discharge current path may be performed if a voltage applied to the pad 14 is higher than a trigger voltage corresponding to a sum of cut-in voltages that is, threshold voltages of the third and fourth PN diodes D16 and D17 coupled in series between the first and second signal lines 851 and 852.

If the first to fourth PN diodes D14, D15, D16 and D17 have the same cut-in voltage and the first and second connection lines 853 and 854 have the same resistance value, the ESD operation generating a portion of the first ESD current flowing through the first discharge current path and the ESD operation generating the other portion of the first ESD current flowing through the second discharge current path may simultaneously occur.

If the first and second PN diodes D14 and D15 or the third and fourth PN diodes D16 and D17 are turned on to generate the first ESD current flowing through the first or second discharge current path, voltage levels of the N-type well region 821 and the P-type well region 822 may be boosted to be higher than the ground voltage VSS. That is, the first and second nodes N1 and N2 may have voltage levels which are higher than the ground voltage VSS. In such a case, the PNPN structural SCR comprised of the NPN BJT Q7 and the PNP BJT Q8 may be turned on to provide a short circuit between the pad 14 and the ground voltage VSS. Accordingly, a second ESD current may flow from the pad 14 toward the ground voltage VSS through the PNPN structural SCR which is turned on.

Figure 17:
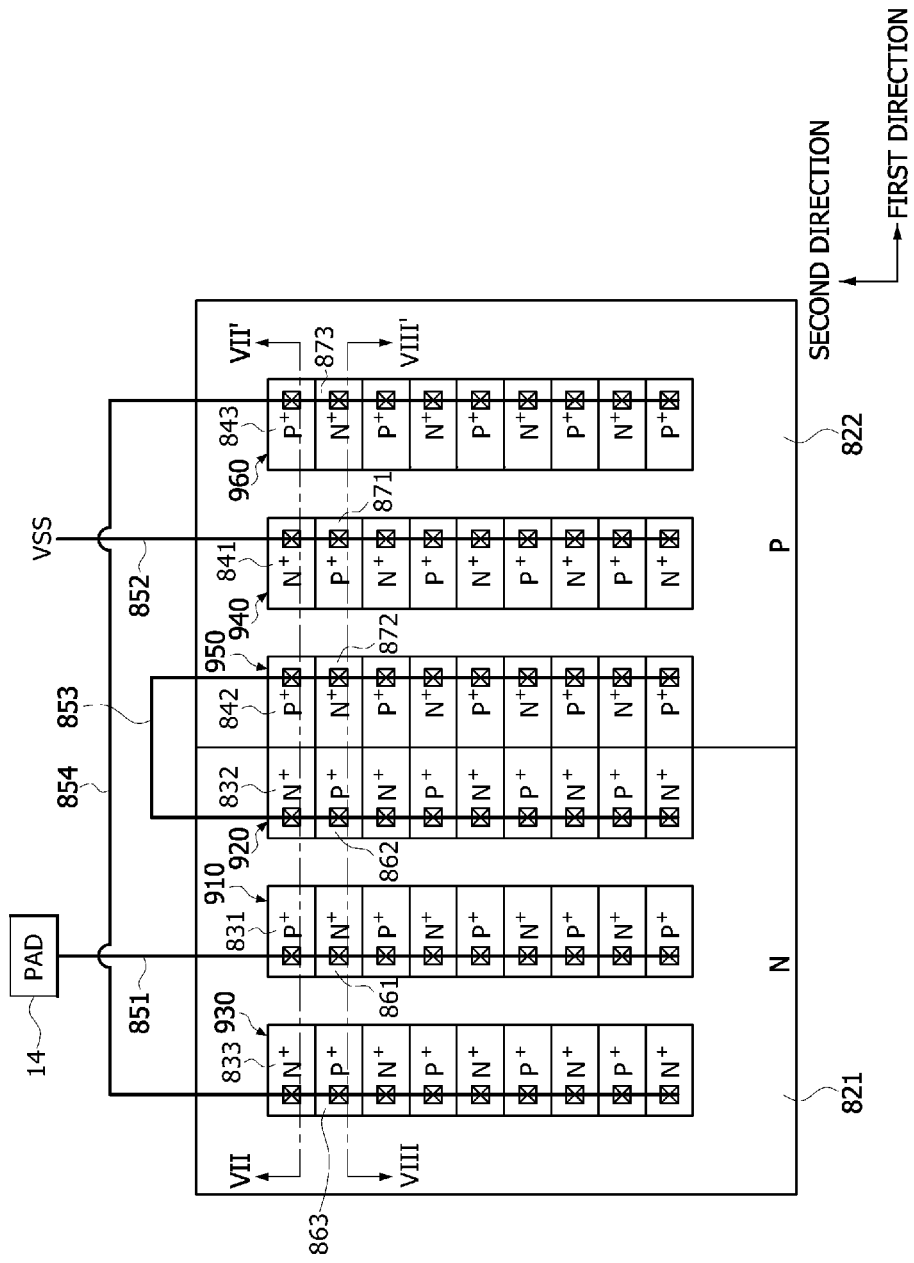
FIG. 17 is a layout diagram of the ESD protection device shown in FIG. 15.

FIG. 17 is a layout diagram of the ESD protection device 800 shown in FIG. 15. The cross-sectional view of FIG. 15 is consistent with a cross-sectional view taken along a line VII-VII' of FIG. 17.

Referring to FIG. 17, the N-type well region 821 and the P-type well region 822 may be disposed so that a sidewall of the N-type well region 821 is in contact with a sidewall of the P-type well region 682 to provide a PN junction between the N-type well region 821 and the P-type well region 822. A first junction segment 910, a second junction segment 920 and a third junction segment 930 may be disposed in the N-type well region 821. The first junction segment 910, the second junction segment 920 and the third junction segment 930 may be spaced apart from each other in a first direction such as, a horizontal direction. The first junction segment 910 may be disposed between the second junction segment 920 and the third junction segment 930. Each of the first, second and third junction segments 910, 920 and 930 may have a stripe shape extending in a second direction such as, a vertical direction which is perpendicular to the first direction. A sidewall of the second junction segment 920 opposite to the first junction segment 910 may overlap with a contact sidewall of the N-type well region 821 and the P-type well region 822.

A fourth junction segment 940, a fifth junction segment 950 and a sixth junction segment 960 may be disposed in the P-type well region 822. The fourth junction segment 940, the fifth junction segment 950 and the sixth junction segment 960 may be spaced apart from each other in the first direction. The fourth junction segment 940 may be disposed between the fifth and sixth junction segments 950 and 960. Each of the fourth, fifth and sixth junction segments 940, 950 and 960 may have a stripe shape extending in the second direction. A sidewall of the fifth junction segment 950 opposite to the fourth junction segment 940 may overlap with the contact sidewall that is, PN junction of the N-type well region 821 and the P-type well region 822. Thus, the fifth junction segment 950 may be in direct contact with the second junction segment 920 at the contact sidewall that is, PN junction of the N-type well region 821 and the P-type well region 822.

The first junction segment 910 may include the plurality of first P-type junction regions 831 and a plurality of fourth N-type junction regions 861 which are alternately arrayed in the second direction. As illustrated in FIG. 17, if two of the first P-type junction regions 831 are respectively disposed at both ends of the first junction segment 910, the fourth N-type junction regions 861 may be disposed between the first P-type junction regions 831. All of the first P-type junction regions 831 and all of the fourth N-type junction regions 861 may be connected to the pad 14 through the first signal line 851.

The second junction segment 920 may also include the plurality of first N-type junction regions 832 and a plurality of fourth P-type junction regions 862 which are alternately arrayed in the second direction. The number of the junction regions 832 and 862 constituting the second junction segment 920 may be equal to the number of the junction regions 831 and 861 constituting the first junction segment 910.

An array configuration of the junction regions 832 and 662 in the second junction segment 920 may be opposite to an array configuration of the junction regions 831 and 861 in the first junction segment 910. That is, the first N-type junction regions 832 of the second junction segment 920 may face the first P-type junction regions 831 of the first junction segment 910 in the first direction, respectively. Similarly, the fourth P-type junction regions 862 of the second junction segment 920 may face the fourth N-type junction regions 861 of the first junction segment 910 in the first direction, respectively. Accordingly, as illustrated in FIG. 17, if two of the first P-type junction regions 831 are respectively disposed at both ends of the first junction segment 910, two of the first N-type junction regions 832 may be respectively disposed at both ends of the second junction segment 920 and the fourth P-type junction regions 862 may be disposed between the first N-type junction regions 832.

The plurality of first N-type junction regions 832 and the plurality of fourth P-type junction regions 862 may be electrically connected to the first connection line 853.

The third junction segment 930 may also include the plurality of second N-type junction regions 833 and a plurality of fifth P-type junction regions 863 which are alternately arrayed in the second direction. The number of the junction regions 833 and 863 constituting the third junction segment 930 may be equal to the number of the junction regions 831 and 861 or 832 and 862 constituting the first junction segment 910 or the second junction segment 920.

An array configuration of the junction regions 833 and 863 in the third junction segment 930 may be the same as an array configuration of the junction regions 832 and 862 in the second junction segment 920 and may be opposite to an array configuration of the junction regions 831 and 861 in the first junction segment 910. That is, the second N-type junction regions 833 of the third junction segment 930 may face the first P-type junction regions 831 of the first junction segment 910 in the first direction, respectively. Similarly, the fifth P-type junction regions 863 of the third junction segment 930 may face the fourth N-type junction regions 861 of the first junction segment 910 in the first direction, respectively. Accordingly, as illustrated in FIG. 17, if two of the first P-type junction regions 831 are respectively disposed at both ends of the first junction segment 910, two of the second N-type junction regions 833 may be respectively disposed at both ends of the third junction segment 930 and the fifth P-type junction regions 863 may be disposed between the second N-type junction regions 833.

The second N-type junction regions 833 and the fifth P-type junction regions 863 may be connected to the second connection line 854.

The fourth junction segment 940 may also include the plurality of third N-type junction regions 841 and a plurality of sixth P-type junction regions 871 which are alternately arrayed in the second direction. The number of the junction regions 841 and 871 constituting the fourth junction segment 940 may be equal to the number of the junction regions constituting each of the first, second and third junction segments 910, 920 and 930.

An array configuration of the junction regions 841 and 871 constituting the fourth junction segment 940 may be opposite to an array configuration of the junction regions 831 and 861 in the first junction segment 910. Accordingly, as illustrated in FIG. 17, if two of the first P-type junction regions 831 are respectively disposed at both ends of the first junction segment 910, two of the third N-type junction regions 841 may be respectively disposed at both ends of the fourth junction segment 940 and the sixth P-type junction regions 871 may be disposed between the third N-type junction regions 841.

All of the third N-type junction regions 841 and all of the sixth P-type junction regions 871 may be electrically connected to the ground voltage VSS through the second signal line 852.

The fifth junction segment 950 may also include the plurality of second P-type junction regions 842 and a plurality of fifth N-type junction regions 872 which are alternately arrayed in the second direction. The number of the junction regions 842 and 872 constituting the fifth junction segment 950 may be equal to the number of the junction regions constituting each of the first, second, third and fourth junction segments 910, 920, 930 and 940.

An array configuration of the junction regions 842 and 872 constituting the fifth junction segment 950 may be the same as an array configuration of the junction regions 831 and 861 constituting the first junction segment 910 and may be opposite to an array configuration of the junction regions 832 and 862 constituting the second junction segment 920 as well as an array configuration of the junction regions 841 and 871 constituting the fourth junction segment 940. That is, the second P-type junction regions 842 of the fifth junction segment 950 may be disposed to face the third N-type junction regions 841 of the fourth junction segment 940 in the first direction, respectively. Similarly, the fifth N-type junction regions 872 of the fifth junction segment 950 may face the sixth P-type junction regions 871 of the fourth junction segment 940 in the first direction, respectively. Moreover, the second P-type junction regions 842 of the fifth junction segment 950 may be disposed to contact the first N-type junction regions 832 of the second junction segment 920 in the first direction, respectively. Similarly, the fifth N-type junction regions 872 of the fifth junction segment 950 may contact the fourth P-type junction regions 862 of the second junction segment 920 in the first direction, respectively. Accordingly, as illustrated in FIG. 17, if two of the first P-type junction regions 831 are respectively disposed at both ends of the first junction segment 910, two of the second P-type junction regions 842 may be respectively disposed at both ends of the fifth junction segment 950 and the fifth N-type junction regions 872 may be disposed between the second P-type junction regions 842.

The junction regions 842 and 872 in the fifth junction segment 950 may be connected to the first connection line 853.

The sixth junction segment 960 may also include the plurality of third P-type junction regions 843 and a plurality of sixth N-type junction regions 873 which are alternately arrayed in the second direction. The number of the junction regions 843 and 873 constituting the sixth junction segment 960 may be equal to the number of the junction regions constituting each of the first to fifth junction segments 910, 920, 930, 940 and 950.

An array configuration of the junction regions 843 and 873 constituting the sixth junction segment 960 may be the same as an array configuration of the junction regions 831 and 861 constituting the first junction segment 910 and may be opposite to an array configuration of the junction regions 841 and 871 constituting the fourth junction segment 940. That is, the third P-type junction regions 843 of the sixth junction segment 960 may be disposed to face the third N-type junction regions 841 of the fourth junction segment 940 in the first direction, respectively. Similarly, the sixth N-type junction regions 873 of the sixth junction segment 960 may face the sixth P-type junction regions 871 of the fourth junction segment 940 in the first direction, respectively. Accordingly, as illustrated in FIG. 17, if two of the first P-type junction regions 831 are respectively disposed at both ends of the first junction segment 910, two of the third P-type junction regions 843 may be respectively disposed at both ends of the sixth junction segment 960 and the sixth N-type junction regions 873 may be disposed between the third P-type junction regions 843.

The junction regions 843 and 873 in the sixth junction segment 960 may be connected to the junction regions 833 and 863 in the third junction segment 930 through the second connection line 854.

As described with reference to FIG. 15 illustrating a cross-sectional view taken along a line VII-VII' of FIG. 17 and FIG. 16 illustrating an equivalent circuit diagram of FIG. 15, if an ESD event occurs when the pad 14 has a voltage level higher than the ground voltage VSS, a portion of the first ESD current may flow along a first discharge current path provided by the first PN diode D14 comprised of the first P-type junction region 831 and the N-type well region 821/the first N-type junction region 832, the first connection line 853, and the second PN diode D15 comprised of the second P-type junction region 842/the P-type well region 822 and the third N-type junction region 841.

Furthermore, if the pad 14 has a voltage level higher than the ground voltage VSS, the other portion of the first ESD current may flow along a second discharge current path provided by the third PN diode D16 comprised of the first P-type junction region 831 and the N-type well region 821/the second N-type junction region 833, the second connection line 854, and the fourth PN diode D17 comprised of the third P-type junction region 843/the P-type well region 822 and the third N-type junction region 841.

In addition, if the first ESD current flows through at least one of the first and second discharge current paths, a second ESD current may also flow along a third discharge current path provided by the PNPN structural SCR comprised of the first P-type junction regions 831, the N-type well region 821/the first N-type junction regions 832, the P-type well region 822/the second P-type junction regions 842, and the third N-type junction regions 841. Since the PNPN structural SCR is turned on by the first ESD current flowing through the first and second PN diodes D14 and D15 or the third and fourth PN diodes D16 and D17, a trigger voltage of the ESD protection device 800 may be set to a sum of the cut-in voltages of the first and second PN diodes D14 and D15 or the third and fourth PN diodes D16 and D17.

If the pad 14 has a voltage level lower than the ground voltage VSS, the ESD operation may be performed by another mechanism which is different from the above mentioned mechanism. The ESD operation performed when the pad 14 has a negative voltage level will be described hereinafter with reference to FIG. 18.

Figure 18:
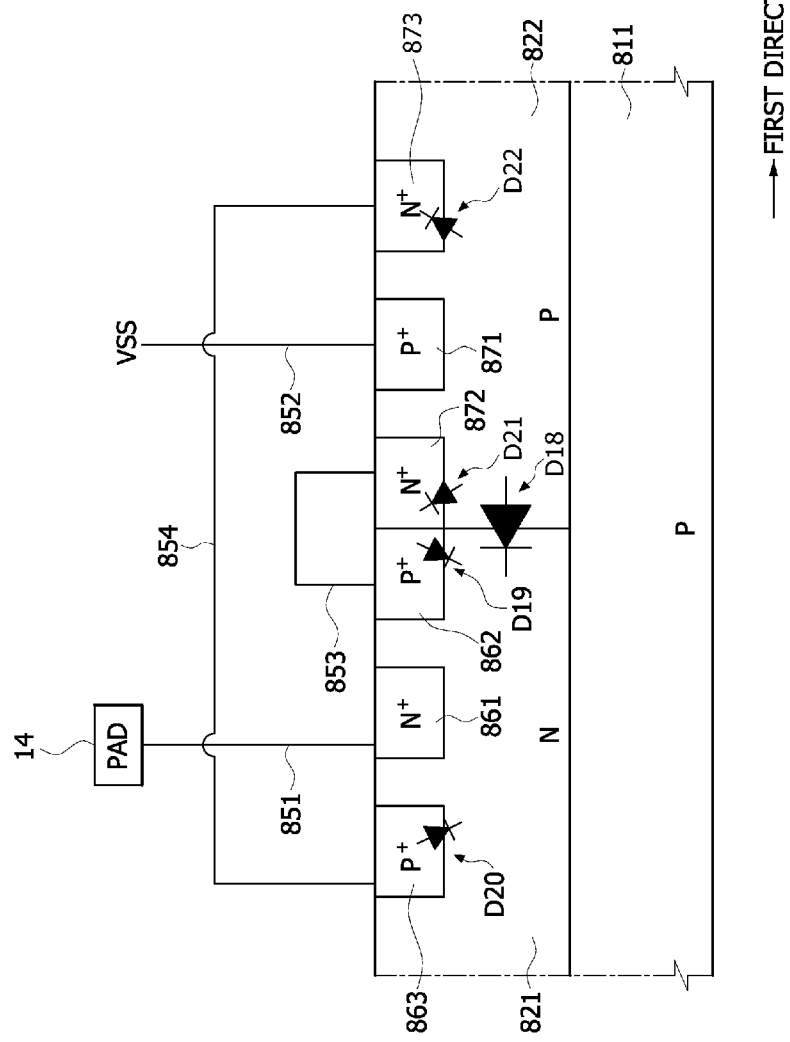
FIG. 18 is a cross-sectional view taken along a line VIII-VIII' of FIG. 17.

FIG. 18 is a cross-sectional view taken along a line VIII-VIII' of FIG. 17. In FIG. 18, the same reference numerals as used in FIGS. 15 and 17 denote the same elements.

Referring to FIG. 18, the fourth N-type junction region 861, the fourth P-type junction region 862 and the fifth P-type junction region 863 may be disposed in an upper portion of the N-type well region 821 spaced apart from each other. The fourth N-type junction region 861 may be disposed between the fourth P-type junction region 862 and the fifth P-type junction region 863. The fourth N-type junction region 861 may be connected to the pad 14 through the first signal line 851. A sidewall of the fourth P-type junction region 862 opposite the fourth N-type junction region 861 may be aligned with a contact sidewall of the N-type well region 821 and the P-type well region 822. The fourth P-type junction region 862 may be connected to the first connection line 853. The fifth P-type junction region 863 may be connected to the second connection line 854. The sixth P-type junction region 871, the fifth N-type junction region 872 and the sixth N-type junction region 873 may be disposed in an upper portion of the P-type well region 822 spaced apart from each other. The sixth P-type junction region 871 may be disposed between the fifth N-type junction region 872 and the sixth N-type junction region 873. The sixth P-type junction region 871 may be connected to the ground voltage VSS through the second signal line 852. A sidewall of the fifth N-type junction region 872 opposite to the sixth P-type junction region 871 may be aligned with the contact sidewall of the N-type well region 821 and the P-type well region 822. Thus, the fifth N-type junction region 872 may be in direct contact with the fourth P-type junction region 862 at the contact sidewall of the N-type well region 821 and the P-type well region 822. In addition, the fifth N-type junction region 872 may be electrically connected to the fourth P-type junction region 862 through the first connection line 853. The sixth N-type junction region 873 may be electrically connected to the fifth P-type junction region 863 through the second connection line 854.

A fifth PN diode D18, a sixth PN diode D19, a seventh PN diode D21, an eighth PN diode D20 and a ninth PN diode D22 may be parasitically provided between the pad 14 and the ground voltage VSS. The fifth PN diode D18 may be comprised of the P-type well region 822/the sixth P-type junction region 871 and the N-type well region 821/the fourth N-type junction region 861. The sixth PN diode D19 may be comprised of the fourth P-type junction region 862 and the N-type well region 821/the fourth N-type junction region 861. The seventh PN diode D21 may be comprised of the sixth P-type junction region 871/the P-type well region 822 and the fifth N-type junction region 872. The eighth PN diode D20 may be comprised of the fifth P-type junction region 863 and the N-type well region 821/the fourth N-type junction region 861. The ninth PN diode D22 may be comprised of the sixth P-type junction region 871/the P-type well region 822 and the sixth N-type junction region 873. If a negative voltage lower than the ground voltage VSS is applied to the pad 14, an ESD current may flow from the ground voltage VSS towards the pad 14 through the fifth PN diode D18. In addition, if the negative voltage is applied to the pad 14, the ESD current may also flow from the ground voltage VSS towards the pad 14 through the ninth PN diode D22, the second connection line 854, and the eighth PN diode D20.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. An electro-static discharge (ESD) protection device comprising:
    an N-type well region and a P-type well region disposed in an upper portion of a P-type substrate to contact each other and to provide a PN junction therebetween;
    a first P-type junction region disposed in an upper portion of the N-type well region and electrically connected to a pad;
    a first N-type junction region disposed in an upper portion of the N-type well region spaced apart from the first P-type junction region;
    a second P-type junction region disposed in an upper portion of the P-type well region;
    a second N-type junction region disposed in an upper portion of the P-type well region spaced apart from the second P-type junction region and electrically connected to the ground voltage; and
    a first external connection line electrically connecting the first N-type junction region to the second P-type junction region,
    wherein the first external connection line is externally isolated from the pad and the ground voltage.

2. The ESD protection device of claim 1, further comprising:
    a third N-type junction region disposed in an upper portion of the N-type well region spaced apart from the first P-type junction region and the first N-type junction region;
    a third P-type junction region disposed in an upper portion of the P-type well region spaced apart from the second P-type junction region and the second N-type junction region; and
    a second external connection line electrically connecting the third N-type junction region to the third P-type junction region.

3. The ESD protection device of claim 1, wherein the second P-type junction region is directly contacted with the first N-type junction region at the PN junction between the N-type well region and the P-type well region.

4. An electro-static discharge (ESD) protection device comprising:
    an N-type well region and a P-type well region disposed in an upper portion of a P-type substrate to contact each other and to provide a PN junction therebetween;
    a first P-type junction region disposed in an upper portion of the N-type well region and electrically connected to a pad;
    a first N-type junction region disposed in an upper portion of the N-type well region spaced apart from the first P-type junction region and in direct contact with the P-type well region at the PN junction between the N-type well region and the P-type well region;
    a second N-type junction region disposed in an upper portion of the N-type well region spaced apart from the first P-type junction region and the first N-type junction region;
    a third N-type junction region disposed in an upper portion of the P-type well region and electrically connected to the ground voltage;
    a second P-type junction region disposed in an upper portion of the P-type well region spaced apart from the third N-type junction region; and
    an external connection line electrically connecting the second N-type junction region to the second P-type junction region,
    wherein the external connection line is externally isolated from the pad and the ground voltage.

5. The ESD protection device of claim 4, wherein the first N-type junction region is floated.

6. An electro-static discharge (ESD) protection device comprising:
    an N-type well region and a P-type well region disposed in an upper portion of a P-type substrate to contact each other and to provide a PN junction therebetween;
    a first P-type junction region disposed in an upper portion of the N-type well region and electrically connected to a pad;
    a first N-type junction region disposed in an upper portion of the N-type well region spaced apart from the first P-type junction region;
    a second N-type junction region disposed in an upper portion of the P-type well region and electrically connected to the ground voltage;
    a second P-type junction region disposed in an upper portion of the P-type well region spaced apart from the second N-type junction region and in direct contact with the N-type well region at the PN junction between the N-type well region and the P-type well region
    a third P-type junction region disposed in an upper portion of the P-type well region spaced apart from the second P-type junction region and the second N-type junction region; and
    an external connection line electrically connecting the first N-type junction region to the third P-type junction region,
    wherein the external connection line is externally isolated from the pad and the ground voltage.

7. The ESD protection device of claim 6, wherein the third P-type junction region is floated.

* * * * *